(12) United States Patent
Chang et al.

(10) Patent No.: US 7,504,748 B2
(45) Date of Patent: Mar. 17, 2009

(54) RELAY SWITCH INCLUDING AN ENERGY DETECTION CIRCUIT

(75) Inventors: Menping Chang, Cupertino, CA (US); Jing Tian, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 738 days.

(21) Appl. No.: 11/151,033

(22) Filed: Jun. 13, 2005

(65) Prior Publication Data
US 2006/0290208 A1 Dec. 28, 2006

(51) Int. Cl.
*H01H 35/00* (2006.01)
(52) U.S. Cl. .................. 307/126; 713/340; 307/DIG. 1
(58) Field of Classification Search .................. 307/126, 307/DIG. 1; 713/340; 340/310.11; 379/413
See application file for complete search history.

(56) References Cited

U.S. PATENT DOCUMENTS

| | | | |
|---|---|---|---|
| 6,715,087 B1 * | 3/2004 | Vergnaud et al. ............ | 713/300 |
| 6,762,675 B1 * | 7/2004 | Cafiero et al. ............ | 340/10.42 |
| 6,804,351 B1 * | 10/2004 | Karam ........................ | 379/413 |
| 7,154,381 B2 * | 12/2006 | Lang et al. ............. | 340/310.11 |
| 7,363,525 B2 * | 4/2008 | Biederman et al. .......... | 713/340 |
| 7,447,307 B2 * | 11/2008 | Molenda et al. ............. | 379/403 |
| 2004/0073597 A1 * | 4/2004 | Caveney et al. ............. | 709/200 |
| 2005/0197094 A1 * | 9/2005 | Darshan et al. ............. | 455/402 |

\* cited by examiner

*Primary Examiner*—Stephen W Jackson
*Assistant Examiner*—Daniel Cavallari
(74) *Attorney, Agent, or Firm*—Patent Law Group LLP; Carmen C. Cook

(57) ABSTRACT

A semiconductor relay switch having two data ports receiving incoming signals and a power supply terminal receiving a power supply voltage is responsive to a power supply voltage level and an energy level of the incoming signals to open and close its conduction paths. The relay switch is open when a valid power supply level is detected and when there is no supply power on the power supply terminal but a high energy level is detected in the incoming signals. The relay switch is closed to allow conduction between the two data ports only when there is no power supply voltage on the power supply terminal and an energy level below a predetermined threshold is detected in the incoming signals. In one embodiment, the semiconductor relay switch includes a main conduction switch circuit, an energy detect circuit and a control signal generator.

13 Claims, 11 Drawing Sheets

RELAY SWITCH INCLUDING AN ENERGY DETECTION CIRCUIT

FIELD OF THE INVENTION

The invention relates to relay switches and, in particular, to a relay switch that is turn on or off based in part on energy detection.

DESCRIPTION OF THE RELATED ART

Power Over Ethernet (PoE) technology has been developed to allow user devices, such as IP telephones, wireless LAN Access Points and other appliances, to receive power as well as data over existing network cabling, without needing to modify the existing Ethernet infrastructure.

In general, a PoE network is formed by a Power Sourcing Equipment (PSE) supplying power and a Powered Device (PD) receiving and utilizing the power. A PSE, typically a midspan network device, injects power onto the twisted pair cables forming the local area network. At the other end of the cables, the power is used to run the Powered Devices so that no additional source of power needs to be provided to the Powered Devices. The Power Sourcing Equipment thereby provides on the same cable both power and data signals to the Powered Devices. When PoE technology is applied to an existing network, the network may include midspan network devices that cannot supply power or user devices that are not PoE compliant and cannot receive power. Therefore, two issues need to be addressed.

First, when a Power Sourcing Equipment is installed in a network, the PSE must determine whether user devices connected to the PSE are compatible with the PoE technology. Thus, a discovery process, run from the PSE, is typically carried out to examine the cable and determine if a device connected to the PSE is PoE compliant and therefore can receive power from the PSE. The discovery process ensures that devices that may not be PoE compliant are not forwarded power and thereby possibly suffer damage. In addition to determining whether the user device has the capability to receive power, the discovery process also determines whether or not a PoE compliant user device actually needs power. This is because a user device, even though PoE compliant, may be receiving power from another source, such as a wall outlet, and therefore does not require power from the PSE.

Second, a PoE compliant Powered Device may be connected to a network device that is not PoE compliant and cannot supply power. In that case, if the Powered Device does not have an alternate power source, then the Powered Device is inoperative but its presence in the network must not disrupt or interfere with the normal operation of the network device.

Several methodologies have been purposed for implementing the Power Over Ethernet technology in existing networks. Industry standard IEEE 802.3af describes one PoE methodology where a PSE runs a discovery process to examine the cable and determine if a device connected to the PSE is compliant with the IEEE 802.3af specification. Under the IEEE 802.3af standard, the PSE applies two small current-limited voltage signals across the cable and checks for the presence of a characteristic resistance. Power is provided only when the specified resistance is detected. Because of the requirement of the characteristic resistance, the IEEE 802.3af specification requires Powered Devices to be built from scratch to incorporate the characteristic resistance in order to be used with Power Sourcing Equipments compliant with the IEEE 802.3af standard.

Other methodologies have been proposed to allow Power Over Ethernet technology to be readily incorporated in existing user devices or appliances without requiring a complete redesign of the user devices or appliances. For instance, one methodology involves using a relay to loop back a unique sequence of signals for the purpose of discovering PoE capability. FIG. 1 illustrates a network including a Powered Device and a network device where the signal loop back discovery method is used to discover PoE capability. Referring to FIG. 1, a network device 1, which may or may not be a Power Sourcing Equipment, is connected through a cable 3 including at least two twisted wire pairs to a client device 2 which is a Powered Device capable of receiving power through the transmission cable 3. Powered Device 2 can also optionally be provided with capability to receive power (Vdd) from an external source (node 5), such as a wall outlet 7 through an optional AC adaptor 6.

In the configuration shown in FIG. 1, if network device 1 is a Power Sourcing Equipment (PSE), then PSE 1 will send out control pulses having a unique sequence to discover whether client devices connected thereto can receive power on the transmission cable and further whether the client devices needs power. If the unique sequence of control pulses is returned to PSE 1 on the cable, then PSE 1 determines that the client device connected thereto is PoE compliant and requires power. If no control pulses are returned back, then PSE 1 determines that the client device connected thereto is either non-PoE compliant or does not require power.

To implement the signal loop back discovery method, a Powered Device as the client device 2 will be associated with a relay 8 coupled to cable 3 for implementing the signal loop back. Relay 8 is controlled by the power supply (node 5) of client device 2 to open and close in response the voltage level of the power supply. Specifically, if power is applied to the power node 5, relay 8 is open and the control pulses will not be looped back. If no Vdd is applied to the Power node, relay 8 is closed and conducting. The control pulses from PSE 1 is thereby looped back on cable 3 to the PSE to indicate to the PSE that power needs to be provided to the powered device through transmission cable 3. When PSE 1 receives the unique signature of the control pulses being sent back, then the PSE determines that client device 2 has the capability to receive power and does not have power. Power is then provided along with data signals to client device 2 on cable 3.

Implementation of the PoE discovery using a relay as shown in FIG. 1 can be problematic, particularly in cases where a powered device is connected to a network device that does not support PoE. In the configuration shown in FIG. 1, when the network device 1 is a PSE device, the PSE device, upon receipt of the returned signals, will recognize the signals as the looped back data and discard or ignore the data accordingly. However, when network device 1 is not a PSE device and when Powered Device 2 does not have power, relay 8 will be closed to cause any signals sent by network device 1 to be looped back to the network device. Network device 1 will treat the loop back data packets as new data and will broadcast or retransmit the data packets in its normal option. The loop back and repeated transmission of the same data packets intended for Powered Device 2 drastically increase the network traffic and often result in jamming. Thus, in a network configuration where a Powered Device is connected to a network device not capable of supplying power, the signal loop back discovery method can result in jamming as large amount of redundant network traffic is put back into the network by the relay.

One solution to the aforementioned problem is to use a filter, such as filter 9 in FIG. 1, to filter out the data packets on the loop back path. When filter 9 is incorporated, only the control pulses are returned back on the twisted wire pairs to allow a PSE to recognize the unique signature of the control pulses. Data packets, not part of the unique sequence of signals, are blocked from being looped back. Thus, when the network device does not supply power, filter 9 will prevent data packets sent to the Powered Devices from being returned to the network device.

However, the filter solution has limitations. First, the control pulse typically has a pulse width of 100 to 150 ns. In a 100 Base-T or 1000 Base-T Ethernet, the pulse width of the data signals is narrow enough so that a filter can accurately filter out the data signals. But in a 10 Base-T network, the pulse width of the data signals is about 50-100 ns and is too close to the pulse width of the control pulses to be effectively distinguished. Thus, the filter solution does work in a 10 Base-T network because the filter cannot differentiate between the data pulses and the control pulses.

Other solutions involve edge counting within certain window to differentiate the low repetition rate of the control pulses and the transition rich data packets. However, such technique is very difficult to implement considering the fact that the Powered Device does not have power. While a positive wave selector can be used to accumulate power, a conventional diode rectifier cannot be used due to the voltage drop across the diode rectifier where such voltage drop is often significant compared to the magnitude of the data signals.

An improved method for practicing signal loop back discovery for a Powered Device in a data network is desired.

SUMMARY OF THE INVENTION

According to one embodiment of the present invention, a semiconductor relay switch having two data ports receiving incoming signals and a power supply terminal receiving a power supply voltage is responsive to a power supply voltage level and an energy level of the incoming signals to open and close its conduction paths. The relay switch is open when a valid power supply level is detected and when there is no supply power on the power supply terminal but a high energy level is detected in the incoming signals. The relay switch is closed to allow conduction between the two data ports only when there is no power supply voltage on the power supply terminal and an energy level below a predetermined threshold is detected in the incoming signals. In one embodiment, the semiconductor relay switch includes a main conduction switch circuit, an energy detect circuit and a control signal generator.

In one embodiment, a relay switch circuit includes a first data port coupled to a first pair of wires carrying a first pair of differential signals, a second data port coupled to a second pair of wires carrying a second pair of differential signals, and a power supply terminal receiving a power supply voltage signal. The relay switch circuit further includes an energy detect circuit coupled to measure the energy of incoming signals on the first data port and the second data port. The energy detect circuit generates a first energy detect signal and a second energy detect signal indicative of an energy level of the incoming signals on the respective first and second data ports. The first and second energy detect signals have a first state when an energy level exceeding a predetermined threshold is measured on the incoming signals at the respective data port and a second state otherwise. The relay switch circuit further includes a control signal generator circuit coupled to receive incoming signals from the first data port and the second data port, the power supply voltage signal, and the first and second energy detect signals. The control signal generator generates one or more control signals in response. The control signal generator derives power for its operation from the incoming signals. Finally, the relay switch circuit includes a switch circuit coupled to the first data port and the second data port and being controlled by the one or more control signals. The switch circuit is operated to open to isolate the first data port from the second data port or close to transmit differential signals onto and receive differential signals from the first and second data ports.

In operation, the control signal generator generates the one or more control signals to cause the switch circuit to open when the power supply voltage signal indicates a valid power supply voltage and to open when the power supply voltage signal indicates an invalid power supply voltage and one of the first and second energy detect signals has the first state. The control signal generator generates the one or more control signals to cause the switch circuit to close when the power supply voltage signal indicates an invalid power supply voltage and both of the first and second energy detect signals have the second state.

According to another embodiment of the present invention, a method for operating a relay switch connected between a first data port and a second data port and receiving a power supply voltage signal includes: measuring the voltage level of the power supply voltage signal, measuring an energy level of incoming signals on either one of the first and second data ports, opening the relay switch to isolate the first and second data ports when the voltage level of the power supply voltage signal is greater than a predetermined supply voltage threshold level, opening the relay switch to isolate the first and second data ports when the voltage level of the power supply voltage signal is equal to or below the predetermined supply voltage threshold level and the energy level of the incoming signals on either one of the first and second data ports is greater than a predetermined energy threshold level, and closing the relay switch to electrically connect the first and second data ports when the voltage level of the power supply voltage signal is equal to or below the predetermined supply voltage threshold level and the energy level of the incoming signals on either one of the first and second data ports is less than or equal to the predetermined energy threshold level.

The present invention is better understood upon consideration of the detailed description below and the accompanying drawings.

DETAILED DESCRIPTION OF THE PREFERRED EMBODIMENTS

Figure 1:
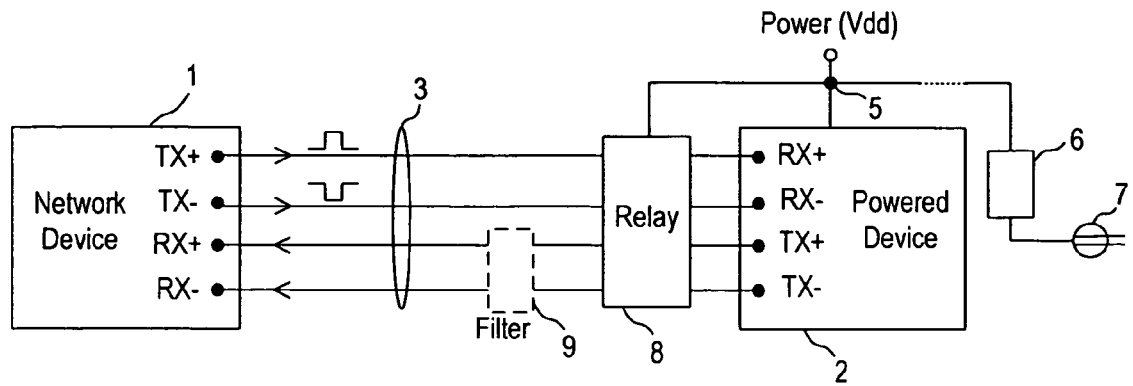
FIG. 1 illustrates a network including a Powered Device and a network device where the signal loop back discovery method is used to discover PoE capability.

In accordance with the principles of the present invention, a semiconductor relay switch having two data ports receiving incoming signals and a power supply terminal receiving a power supply voltage is responsive to a power supply voltage level and an energy level of the incoming signals to open and close its conduction paths. The relay switch is open when a valid power supply level is detected and when there is no supply power on the power supply terminal but a high energy level is detected in the incoming signals. The relay switch is closed to allow conduction between the two data ports only when there is no power supply voltage on the power supply terminal and an energy level below a predetermined threshold is detected in the incoming signals. In one embodiment, the semiconductor relay switch includes a main conduction switch circuit, an energy detect circuit and a control signal generator.

Importantly, the relay switch of the present invention extracts energy from the incoming signals so that the relay switch can operate to close the conduction paths even when there is no power supply voltage provided to the relay switch. In one embodiment, the relay switch draws power using a positive wave selector that does not incur undesired voltage drop to enable effective operation for the input signals having limited voltage range. By accumulating energy for its operation from the incoming signals, the relay switch of the present invention can be operated without a separate power supply and is therefore useful in applications where a separate power supply is not available or cannot be provided, such as when the relay switch is coupled to a Powered Device implementing Power Over Ethernet (PoE) technology.

In one application, the relay switch is coupled to a PoE-compliant Powered Device to facilitate discovery in a network utilizing the signal loop back discovery method described above. When the relay switch of the present invention is applied in a Powered Device for implementing signal loop back discovery, the relay switch operates to return only the unique sequence of control pulses, sent by a Power Sourcing Equipment (PSE) for discovery purposes, when the Powered Device does not have supply power. The relay switch will not return incoming signals that are data packets, thereby avoiding jamming a network device connected to the Powered Device in the event that the network device is not a PoE compliant PSE.

In one embodiment, the main conduction switch circuit of the relay switch is constructed using a dual-switching-device configuration for each conduction path. The dual-switching-device arrangement enables the relay switch to achieve good isolation between the two data ports of the relay switch. Furthermore, in another embodiment, a low impedance-shunting path is inserted between each pair of switching devices to further improve the isolation between the two data ports.

In another embodiment, the energy detect circuit is implemented as a control slew peak detector where the time constant of the circuit is determined by the selective arrangement of a series of resistors and capacitors. In this manner, the relay switch is able to pass incoming signals having a low pulse density, indicative of low energy level, while filtering out incoming signals that are data packets which have a high pulse density, indicative of high energy level.

Figure 2:
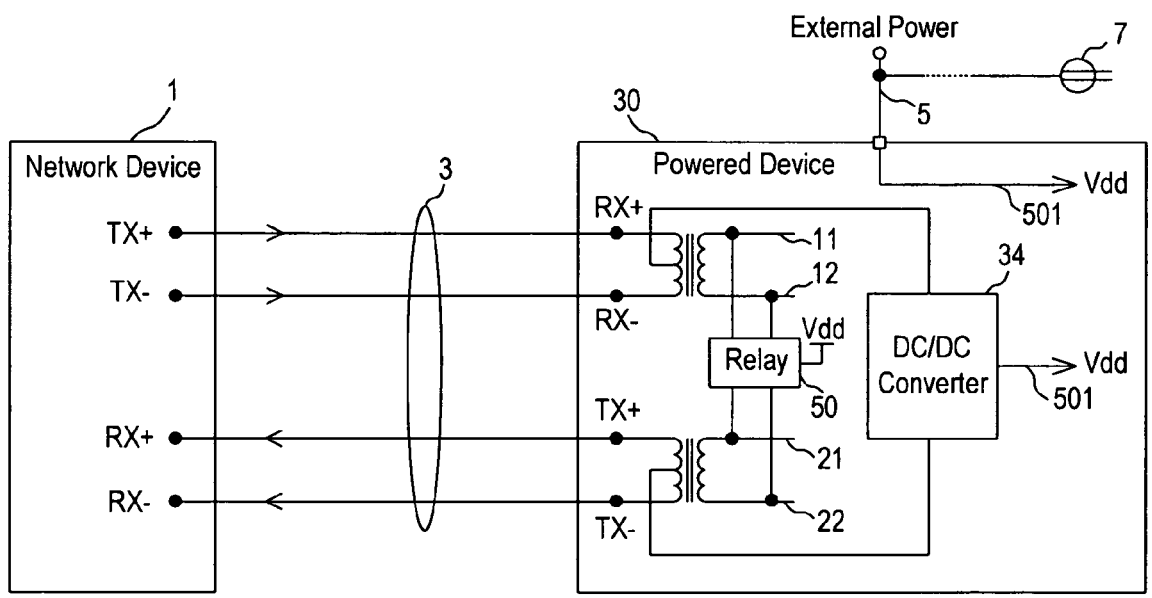
FIG. 2 illustrates the incorporation of the relay switch of the present invention in a Powered Device coupled to a network device via a transmission cable according to one embodiment of the present invention.

The construction of the relay switch of the present invention will now be described. First, the connection of the relay switch in a Powered Device is described with reference to FIG. 2. FIG. 2 illustrates the incorporation of the relay switch of the present invention in a Powered Device coupled to a network device via a transmission cable according to one embodiment of the present invention. When the Powered Device is configured to respond to the signal loop back discovery method for discovering PoE capability, the relay switch of the present invention can facilitate such discovery while avoiding jamming of the network device.

Referring to FIG. 2, a Powered Device 30 is connected to a network device 1 through a transmission cable 3. Network device 1 may or may not be a Power Sourcing Equipment and therefore may or may not be capable of providing power to Powered Device 30. In the present illustration, the network configuration is an Ethernet and transmission cable 3 is assumed to be a twisted-wire-pairs cable transmitting differential signals. Furthermore, Powered Device 30 is assumed to be implementing the PoE technology by transmitting power through the cable on the data pairs. At the Powered Device, the twisted wire pairs of cable 3 are transformer coupled and power is received from the center tap of the isolation transformer. The received power is coupled to an isolated DC-DC converter 34 to transform the received voltage to a lower voltage more suitable for the electronics in the Powered Device. A Vdd voltage (node 501) for the Powered Device is thus derived. In the present illustration, Powered Device 30 is also provided with the capability for receiving power from an external power source (node 5), such as from a battery or from an outlet 7. The received power from the external power source is also coupled to the electronics of the Powered Device as a Vdd voltage on node 501.

A relay switch 50 in accordance with the present invention has a first data port coupled to the receiving terminals (RX+/−) of Powered Device 30 and a second data port coupled to the transmitting terminals (TX+/−) of Powered Device 30. In the present illustration, the incoming signals (or input signals) are differential signals and the receiving and transmitting terminals are therefore differential signal terminals. It is understood that in many network devices, the "transmitting" and "receiving" terminals are interchangeable and the designations thereof are symbolic only. Therefore, an important feature of the relay switch of the present invention is that the relay switch is fully bi-directional to enable signal conduction from either data port to the other data port, as will be described in more detail below.

Relay switch 50 is also coupled to receive the Vdd voltage (node 501) of Powered Device 30 on a power supply terminal. As thus configured, relay switch 50 receives the Vdd voltage, if any, applied to node 501 of Powered Device 30, and also receives input signals on either of the first and second data ports. Relay switch 50 operates in response to the Vdd voltage value on node 501 and the energy level of the input signals on either of the data ports to either open or close the one or more conduction paths through the relay switch.

More specifically, the relay switch measures the energy of the incoming signals and, in the absence of a power supply voltage, the operation of the relay switch is responsive to the energy level of the incoming signals. The amount of energy of the incoming signals is proportional to the density of the signal pulses. The control pulses transmitted for discovery purposes usually have limited data content and is therefore represented as a burst of data. The control pulses thus have associated therewith a low energy level as the control pulses have low pulse density. On the other hand, data signals are usually transmitted in the form of data packets that are transmitted more or less continuously. The data signals thus have a relatively high pulse density and therefore have associated therewith a high energy level.

In operation, when Powered Device 30 receives a valid Vdd voltage on node 501, either from the external power supply (node 5) or from the internal power source (such as from DC/DC converter 34), relay switch 50 detects the presence of the valid power supply voltage and opens the conduction paths to isolate the two data ports. Thus, whenever there is a valid Vdd voltage on node 501, relay switch 50 is open.

When relay switch 50 detects that Powered Device 30 has no power supply voltage, the relay switch is operative to allow only signals with low energy level to pass, thereby filtering out incoming signals of high energy level. Specifically, relay switch 50 is open when a high energy level is detected in the incoming signals and the relay switch is closed when a low energy level is detected in the incoming signals. Therefore, when Powered Device 30 has no power, the relay switch will operate to permit control pulses, if any, received on either of the data ports to pass while filtering out data packets arriving on the data ports. In this manner, when the Powered Device has no power, the relay switch is operated to return only control pulses to facilitate discovery and prevent the return of data signal packets which may cause jamming of the network device that is transmitting the data signal packets to the Powered Device.

Thus, if network device 1 is a PSE, network device 1, initiating the discovery process, will transmit control pulses having a unique sequence on cable 3 to Powered Device 30. Relay switch 50, detecting no Vdd voltage provided to Powered Device 30, will measure the energy of the incoming control pulses. When relay switch 50 determines that the energy of the incoming control pulses is less than a predetermined threshold, relay switch 50 is closed and the control pulses pass through the relay switch back on cable 3 to be returned to network device 1. When network device 1 receives the returned control pulses, network device 1 recognizes that Powered Device 30 is capable of receiving power and requires power. Network device 1 will thereafter supply power to Powered Device 30 on cable 3. With the provision of power on cable 3, relay switch So detects the presence of a valid Vdd voltage on node 501 and the relay switch will open as the discovery process has been completed.

On the other hand, if network device 1 is not a PSE, network device 1 may transmit data packets on cable 3 to Powered Device 30. If Powered Device 30 has no power, relay switch 50 will measure the energy of the incoming signals and will detect a high level of energy present. Relay switch 50 in response will be open to prevent the data packets from being returned to network device 1. In this manner, jamming of network device 1, which is not a PSE, is prevented. In the situation where Powered Device 30 is connected to a network device that cannot provide power, as long as Powered Device 30 does not generate network traffic, the presence of Powered Device 30 does not disturb the network. The result is merely that Powered Device 30 cannot function unless power is provided by another power source.

FIG. 2 is provided to illustrate one application where the relay switch of the present invention can be advantageously applied to a Powered Device to facilitate PoE discovery. The network configuration shown in FIG. 2 is illustrative only and one of ordinary skill in the art, upon being apprised of the present description, will appreciate that the relay switch of the present invention can be applied in a variety of PoE topologies, such as the PoE topology where power is transmitted through the spare twisted wire pairs of the transmission cable. Furthermore, the relay switch of the present invention can be an integrated component of the Powered Device or an external component coupled to the Powered Device. The exact configuration and level of integration of the relay switch is not critical to the practice of the present invention.

Figure 3:
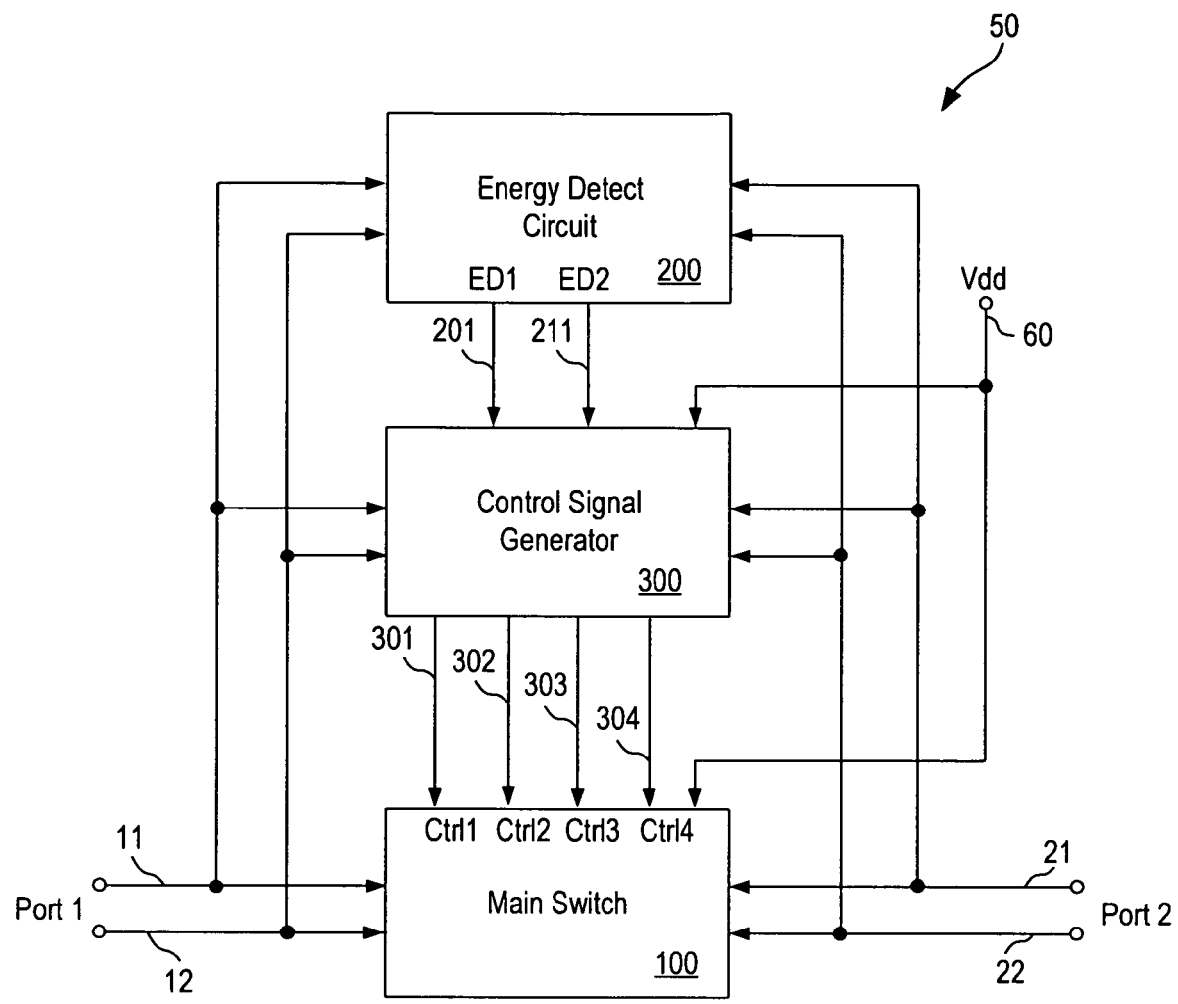
FIG. 3 is a block diagram of a relay switch according to one embodiment of the present invention.

FIG. 3 is a block diagram of a relay switch according to one embodiment of the present invention. Referring to FIG. 3, relay switch 50 includes a main conduction switch circuit (main switch) 100, an energy detect circuit 200 and a control signal generator 300. Relay switch further includes a first data port (Port 1) coupled to receive or transmit differential signals on wires 11 and 12 and a second data port (Port 2) coupled to receive or transmit differential signals on wires 21 and 22. Relay switch 50 also includes a power supply terminal 60 coupled to receive a power supply (Vdd) voltage which is usually the power supply voltage of the device to which the relay switch is coupled. For example, if relay switch 50 is coupled in Powered Device 30 of FIG. 2, then the Vdd voltage on node 60 received by relay switch 50 will be the Vdd voltage on node 501 of Powered Device 30.

Main conduction switch circuit 100 is coupled to the first and second data ports to receive the incoming differential signals (input signals) and also coupled to receive a set of control signals Ctrl1, Ctrl2, Ctrl3 and Ctrl4 from control signal generator 300. Under the direction of the control signals, main switch 100 is either closed to electrically connect the first data port to the second data port or open to electrically isolate the first data port from the second data port. When main switch 100 is closed, data signals received on either data port will be transmitted to the other data port. Main switch 100 is also coupled to the power supply terminal 60 to receive the power supply (Vdd) voltage. The Vdd voltage is used by main switch 100 to create a shunting path, as will be described in more detail below.

Energy detect circuit 200 is also coupled to the first and second data ports to receive the incoming differential signals. Energy detect circuit 200 operates to measure the energy level of incoming signals on the first and second data ports and generate a first energy detect signal ED1 and a second energy detect signal ED2 as output signals. Specifically, the first energy detect signal ED1 is indicative of the energy level of the incoming signals on the first data port while the second energy detect signal ED2 is indicative of the energy level of the incoming signals on the second data port. The first and second energy detect signals ED1 and ED2 are coupled to control signal generator 300 to generate control signals Ctrl1 to Ctrl4. Energy detect circuit 200 has to operate under conditions where there is no power supply voltage. Therefore, energy detect circuit 200 derives energy from the incoming signal for its operation.

Control signal generator 300 is coupled to receive the Vdd voltage supplied to power supply terminal 60 and also the first and second energy detect signals ED1 and ED2 from energy detect circuit 200. Control signal generator 300 generates control signals Ctrl1 to Ctrl4 based on the state of the Vdd voltage and the energy detect signals ED1 and ED2. Because relay switch 50 has to operate in conditions where no power supply voltage is provided, control signal generator 300 derives energy for its operation from the input signals on the first data port and the second data port. Thus, control signal generator 300 is also coupled to the first data port and the second data port to receive the input signals.

Control signals Ctrl1, Ctrl2, Ctrl3 and Ctrl4 generated by control signal generator 300 control the conduction state of main switch 100 in a manner described above. There is, control signals Ctrl1, Ctrl2, Ctrl3 and Ctrl4 cause main switch 100 to be open when there is a valid Vdd voltage on power supply terminal 60 or when there is no Vdd voltage on the power supply terminal but energy detect signals ED1 and ED2 indicate a high energy level in the incoming signals at either one of the data ports. On the other hand, control signals Ctrl1, Ctrl2, Ctrl3 and Ctrl4 cause main switch 100 to be closed and conducting when there is no Vdd voltage on the power supply terminal but the energy detect signals ED1 and ED2 indicate a low energy level in the input signals at either one of the data ports.

Figure 4:
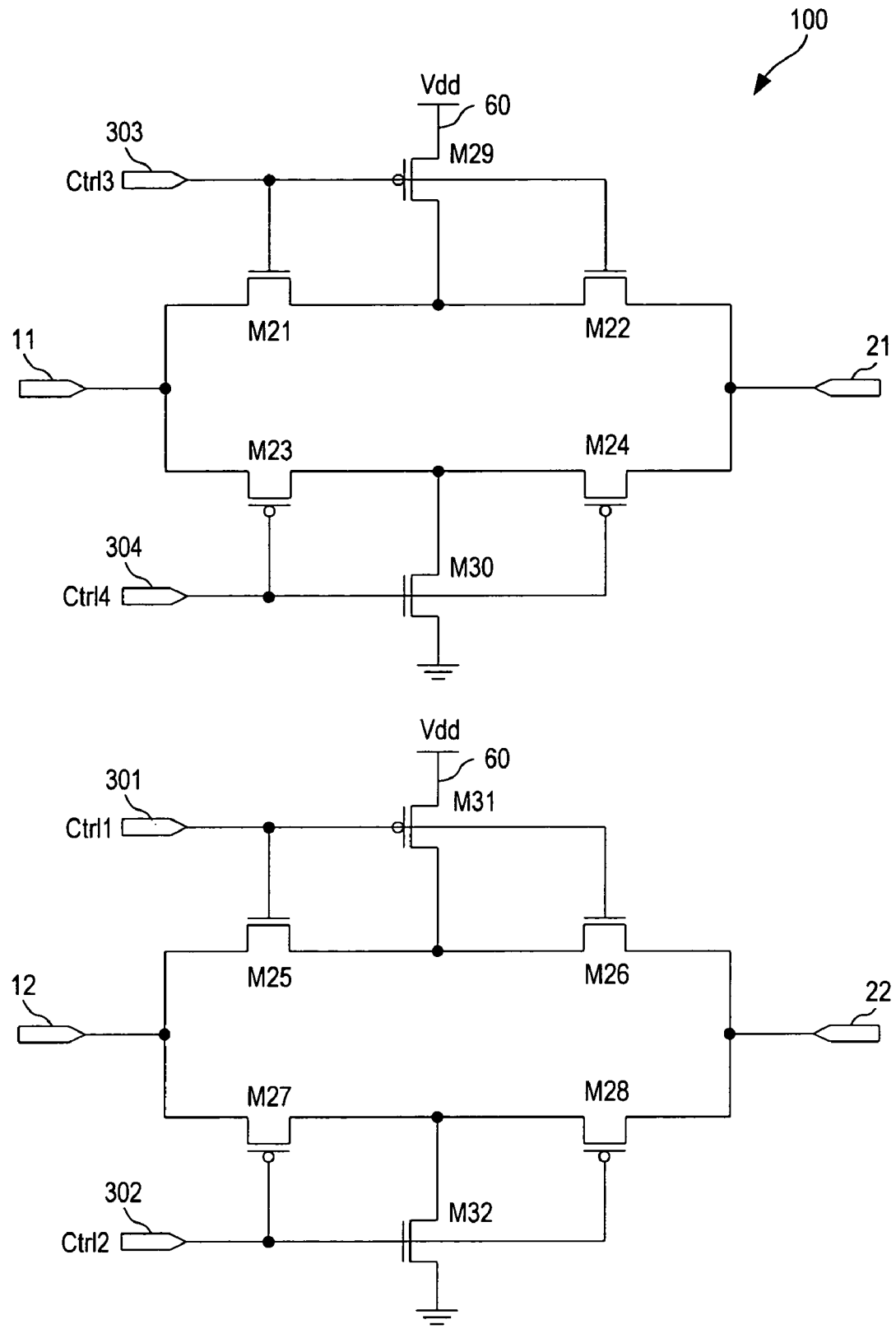
FIG. 4 is a circuit diagram of the main conduction switch circuit of the relay switch according to one embodiment of the present invention.

The detail construction of each circuit block of relay switch 50 will now be described. FIG. 4 is a circuit diagram of the main conduction switch circuit of the relay switch according to one embodiment of the present invention. Referring to FIG. 4, main conduction switch circuit 100 (or "main switch 100") includes two circuit portions of identical construction. The first circuit portion connects wire 11 of the first data port to wire 21 of the second data port. The second circuit portion connects wire 12 of the first data port to wire 22 of the second data port. Each circuit portion includes complementary MOSFET devices for forming a pair of conduction paths between the two wires so that signal transmission between the two wires can be accomplished without appreciable attenuation.

In accordance with the present invention, each conduction path in main switch 100 is formed using a dual-switching-devide structure. That is, each conduction path includes two serially connected switching devices between the two wires. For instance, in the first circuit portion, NMOS transistor M21 and NMOS transistor M22 are connected in series between wire 11 and wire 21 to form a first conduction path. PMOS transistor M23 and PMOS transistor M24 are connected in series between wire 11 and wire 21 to form a second, complementary conduction path. In the second circuit portion, NMOS transistor M25 and NMOS transistor M26 are connected in series between wire 12 and wire 22 to form a third conduction path. PMOS transistor M27 and PMOS transistor M28 are connected in series between wire 12 and wire 22 to form a fourth, complementary conduction path.

The dual-switching device structure used for each conduction path provides improved isolation of the two ends of the conduction paths when the relay switch is open and the conduction paths are turned off. The dual-switching device structure provides a marked improvement in isolation over switching circuit where a single transmission gate is used to connect the two wires at each end. Furthermore, at each conduction path, a low-impedance shunting path is inserted between the two serially connected switching devices to shunt the conduction path to either the Vdd voltage or the ground voltage. The low-impedance shunting path is effective to significantly reduce high frequency signal transmission between the two ends of the conduction path when the switching devices are open.

The conduction paths and shunting paths of main switch 100 are controlled by the control signals Ctrl1 to Ctrl4. Control signal Ctrl3 (node 303) and control signal Ctrl4 (node 304) form a pair of complementary control signals driving the first and second conduction paths connecting wires 11 and 21. In the present embodiment, control signal Ctrl3 drives the gate terminal of NMOS transistors M21 and M22 and PMOS transistor M29 while complementary control signal Ctrl4 drives the gate terminal of PMOS transistors M23 and M24 and NMS transistor M30. Thus, when control signals Ctrl3 and Ctrl4 are asserted to close the relay switch, transistors M21, M22, M23 and M24 are turned on to close the first and second conduction paths while transistors M29 and M30 are turned off. When control signals Ctrl3 and Ctrl4 are deasserted to open the relay switch, transistors M21, M22, M23 and M24 are turned off to open the first and second conduction paths while transistors M29 and M30 are turned on to shunt the conduction paths to the Vdd voltage and the ground voltage respectively. In this manner, improved isolation of wires 11 and 21 when the relay switch is open is achieved.

The second circuit portion is controlled in a similar manner to the first circuit portion described above. Specifically, control signals Ctrl1 (node 301) and control signal Ctrl2 (node 302) form a pair of complementary control signals driving the third and fourth conduction paths connecting wires 12 and 22. In the present embodiment, control signal Ctrl1 drives the gate terminal of NMOS transistors M25 and M26 and PMOS transistor M31 while complementary control signal Ctrl2 drives the gate terminal of PMOS transistors M27 and M28 and NMS transistor M32. Thus, when control signals Ctrl1 and Ctrl2 are asserted to close the relay switch, transistors M25, M26, M27 and M28 are turned on to close the third and fourth conduction paths while transistors M31 and M32 are turned off. When control signals Ctrl1 and Ctrl2 are deasserted to open the relay switch, transistors M25, M26, M27 and M28 are turned off to open the third and fourth conduction paths while transistors M31 and M32 are turned on to shunt the conduction paths to the Vdd voltage and the ground voltage respectively. In this manner, improved isolation of wires 12 and 22 when the relay switch is open is achieved.

Figure 5:
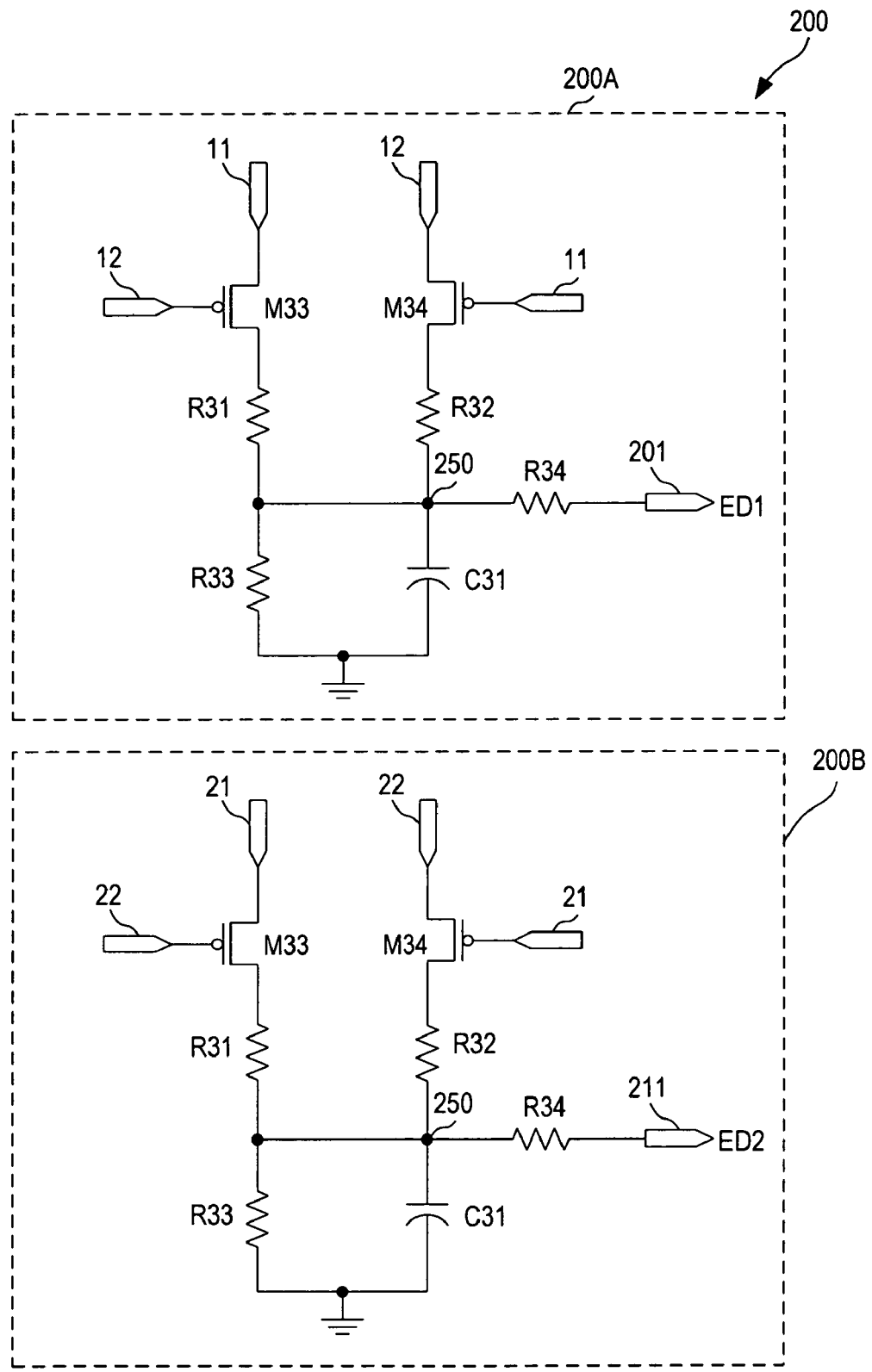
FIG. 5 is a circuit diagram of the energy detect circuit of the relay switch according to one embodiment of the present invention.

Turning now to the energy detect circuit of the relay switch of the present invention. FIG. 5 is a circuit diagram of the energy detect circuit of the relay switch according to one embodiment of the present invention. Referring to FIG. 5, energy detect circuit 200 includes a first detect circuit 200A for detecting the energy of input data signals on the first data port (Port 1) associated with wires 11 and 12 and a second detect circuit 200B for detecting the energy of input data signals on the second data port (Port 2) associated with wires 21 and 22. The first detect circuit 200A and the second detect circuit 200B have identical construction and identical elements are given identical reference numerals to simplify the discussion. In the following description, the construction and operation of only the first detect circuit 200A will be described in detail. It is understood that the first detect circuit 200A receives incoming signals from wires 11 and 12 and generate an energy detect signal ED1 indicative of the energy level of the incoming signals on wires 11 and 12. It is further understood that the second detect circuit 200B operates in the same manner to receive incoming signals from wires 21 and 22 and generate an energy detect signal ED2 indicative of the energy level of the incoming signals on wires 21 and 22.

In the present description, the energy of a signal refers to the envelop of the signal pulses where a high pulse density in the signal pulses is associated with a high energy level and a low pulse density in the signal pulses is associated with a low energy level. The energy detect circuit of the present invention measures the energy level of the incoming signals to determine if the signal pulses are high energy and therefore are most likely data pulses or low energy and therefore are most likely control pulses.

It is important to note that energy detect circuit 200 has to function under conditions where there is no power supply voltage and therefore energy detect circuit 200 is configured to obtain power from the input signals for its operation. In the present embodiment, a positive wave selector is used to accumulate power from the input signals. Referring to FIG. 5, first detect circuit 200A includes a pair of PMOS transistors M33 and M34 connected to the differential input signals of wires 11 and 12 in opposite polarities to form the positive wave selector. Specifically, PMOS transistor M33 has a drain terminal coupled to wire 11 and a gate terminal coupled to wire 12 while PMOS transistor M34 has a drain terminal coupled to wire 12 and a gate terminal coupled to wire 11. Because the signals on wires 11 and 12 are differential signals, the alternate coupling of the differential signals to transistors M33 and M34 results in the passing of only positive waves on either wires through the transistors.

In operation, when the signal on wire 11 is high and the signal on wire 12 is accordingly low, transistor M33 is turned on while transistor M34 is turned off. The positive wave on wire 11 thus passes through transistor M33 while the negative wave on wire 12 is blocked. Alternately, when the signal on wire 11 is low and the signal on wire 12 is accordingly high, transistor M33 is turned off while transistor M34 is turned on. The positive wave on wire 12 thus passes through transistor M34 while the negative wave on wire 11 is blocked. Thus, one of the transistors M33 and M34 forming the positive wave selector will pass a positive wave and one of the transistors will guarantee to turn on as the two signals on wires 11 and 12 are differential signals. An important advantage of the positive wave selector used in the energy detect circuit of the present invention is that no voltage drop is incurred across the positive wave selector. This is a significant improvement over conventional positive wave selectors where a diode rectifier is used to accomplish full wave rectification and appreciable voltage drop is induced across the diode rectifier.

To realize the energy detect function, first detect circuit 200A includes a resistor R31 and a resistor R33 connected in series between the source terminal of transistor M33 and the ground node. First detect circuit 200A further includes a resistor R32 and a capacitor C31 connected in series between the source terminal of transistor M34 and the ground node. The common node between resistors R31 and R33 and the common node between resistor R32 and capacitor C31 are shorted together to form a single common node 250. Common node 250 is connected to a resistor R34 to generate the energy detect signal ED1 at node 201.

The operation of the energy detect circuitry of first detect circuit 200A is as follows. Resistors R31 and R32 convert the voltage signal at the respective source terminals of transistors M33 and M34 into a current where the current is coupled to charge capacitor C31. The resistance of resistors R31 and R32 is selected so that only a portion of the current is permitted to pass to charge up capacitor C31. Resistors R31 and R32 also operate to isolate wires 11 and 12 from each other. Resistor R33, on the other hand, is connected in parallel with capacitor C31 and functions as a discharging path for the capacitor. While capacitor C31 is being charged up, resistor R33 continuously discharges the capacitor. The charging of capacitor C31 is therefore a function of the pulse density of the input signals on wires 11 and 12. The resistance of resistors R31 to R33 and the capacitance of capacitor C31 are selected to realize a desired time constant where input signals having a high pulse density are able to charge up capacitor C31.

Specifically, as positive waves are received by transistors M33 and M34 and passed through resistors R31 and R32 to charge capacitor C31, resistor R33 discharges the capacitor. Thus, when the positive waves at wires 11 and 12 have a high pulse density, capacitor C31 charges up faster than resistor R33 can discharge it. Therefore, the voltage at common node 250 increases. On the other hand, when the positive waves at wires 11 and 12 have a low pulse density, resistor R33 discharges capacitor C31 faster than charge can be accumulated at the capacitor and capacitor C31 cannot be charged up. The voltage at common node 250 therefore decreases towards the ground potential.

Resistor R34, coupled between common node 250 and output node 201, is used to adjust the time constant of first detect circuit 200A as given by resistors R31 to R33 and capacitor C31. Resistor R34 also provides some degree of isolation for the output node 201. Resistor R34 is optional and may be omitted in other embodiments of the present invention.

Through the charging and discharging of capacitor C31, a voltage indicative of the pulse density of the input signals on wires 11 and 12 is generated at node 250 and attenuated by resistor R34 to be used as the first energy detect signal ED1 on node 201. Energy detect signal ED1 is therefore a signal indicative of the energy level of the input signals on wires 11 and 12. Similarly, at second detect circuit 200B, energy detect signal ED2 is generated as a signal indicative of the energy level of the input signals on wires 21 and 22.

Figure 6:
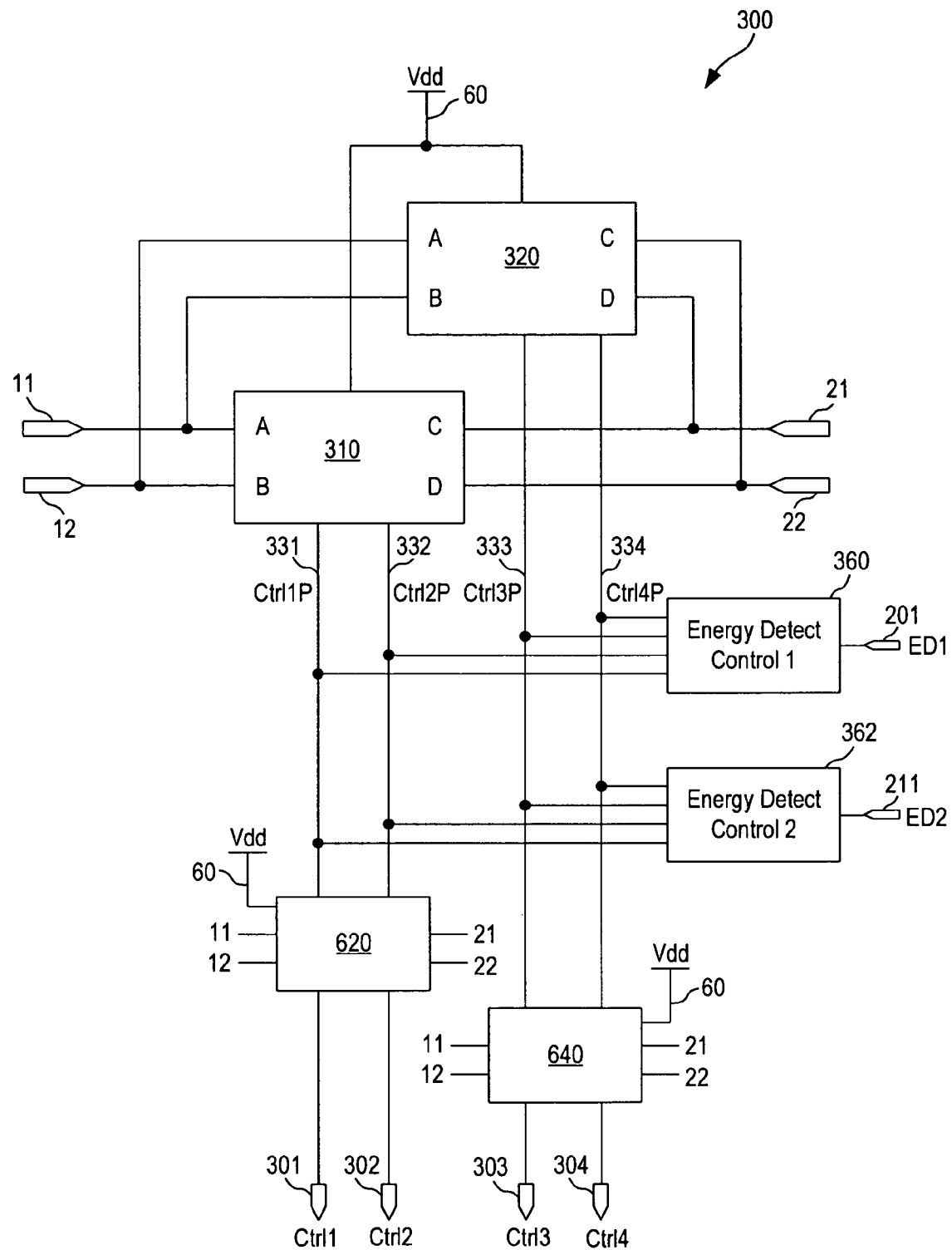
FIG. 6 is a circuit diagram of the control signal generator of the relay switch according to one embodiment of the present invention.

Turning now to the control signal generator of the relay switch of the present invention. FIG. 6 is a circuit diagram of the control signal generator of the relay switch according to one embodiment of the present invention. Referring to FIG. 6, control signal generator 300 includes a first generator circuit 310 and a second generator circuit 320 of identical construction and operating on different polarities of the input signals on wires 11, 12, 21 and 22. Each generator circuit includes input ports A, B, C and D for receiving the differential input signals on wires 11, 12, 21 and 22. Each generator circuit also receives the Vdd voltage (node 60).

First generator circuit 310 has wire 11 coupled to port A, wire 12 coupled to port B, wire 21 coupled to port C and wire 22 coupled to port D. First generator circuit 310 generates a pair of complementary control signals Ctrl1P and Ctrl2P on nodes 331 and 332 as output signals. On the other hand, second generator circuit 320 has wire 11 coupled to port B, wire 12 coupled to port A, wire 21 coupled to port D and wire 22 coupled to port C. Second generator circuit 320 generates the pair of complementary control signals Ctrl3P and Ctrl4P on nodes 333 and 334 as output signals. Control signals Ctrl1P, Ctrl2P, Ctrl3P and Ctrl4P are precursor signals to the final control signals Ctrl1, Ctrl2, Ctrl3 and Ctrl4 generated by control signal generator 300, as will be explained in more detail below.

Control signal generator 300 further includes a first energy detect control circuit (Energy Detect Control 1) 360 and a second energy detect control circuit (Energy Detect Control 2) 362 coupled to operate on the precursor control signals Ctrl1P, Ctrl2P, Ctrl3P and Ctrl4P. First energy detect control circuit 360 drives the precursor control signals in response to the first energy detect signal ED1 while second energy detect control circuit 362 drives the precursor control signals in response to the second energy detector signal ED2. Finally, in control signal generator 300, precursor control signals Ctrl1P, Ctrl2P, Ctrl3P and Ctrl4P on nodes 331 to 334 are coupled to respective first and second latch circuits 620, 640 to generate the final control signals Ctrl1, Ctrl2, Ctrl3 and Ctrl4 on nodes 301 to 304. First and second latch circuits 620, 640 each receives the input signals on wires 11, 12, 21 and 22 from the first and second data ports and the Vdd voltage to facilitate its operation. Each of first and second latch circuits 620, 640 operates through feedback to reinforce the signal levels of the precursor control signals to generate final control signals Ctrl1, Ctrl2, Ctrl3 and Ctrl4 having the desired voltage levels.

Figure 7:
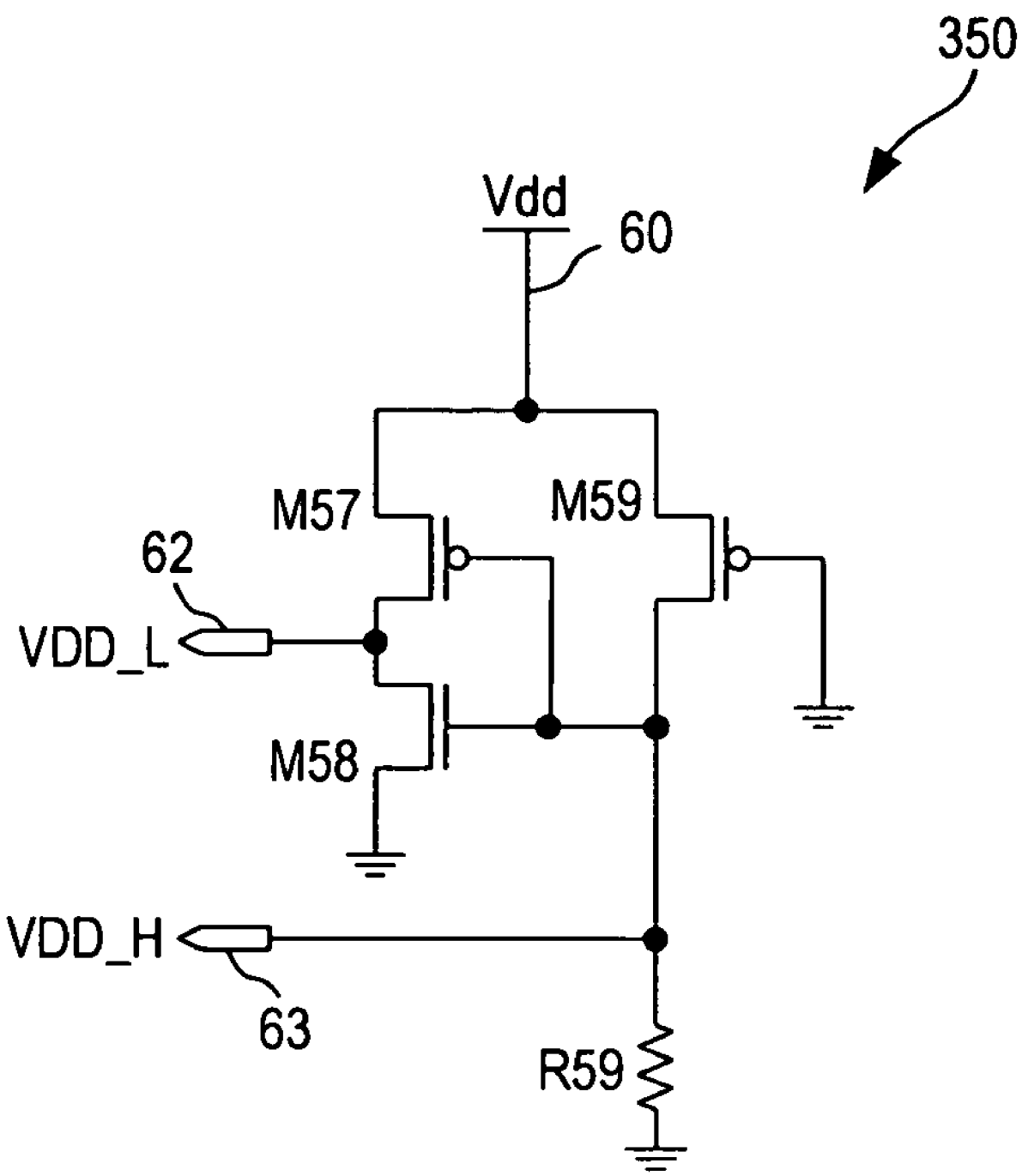
FIG. 7 is a circuit diagram of a Vdd level generator circuit incorporated in the control signal generator of FIG. 6 according to one embodiment of the present invention.
Figure 8:
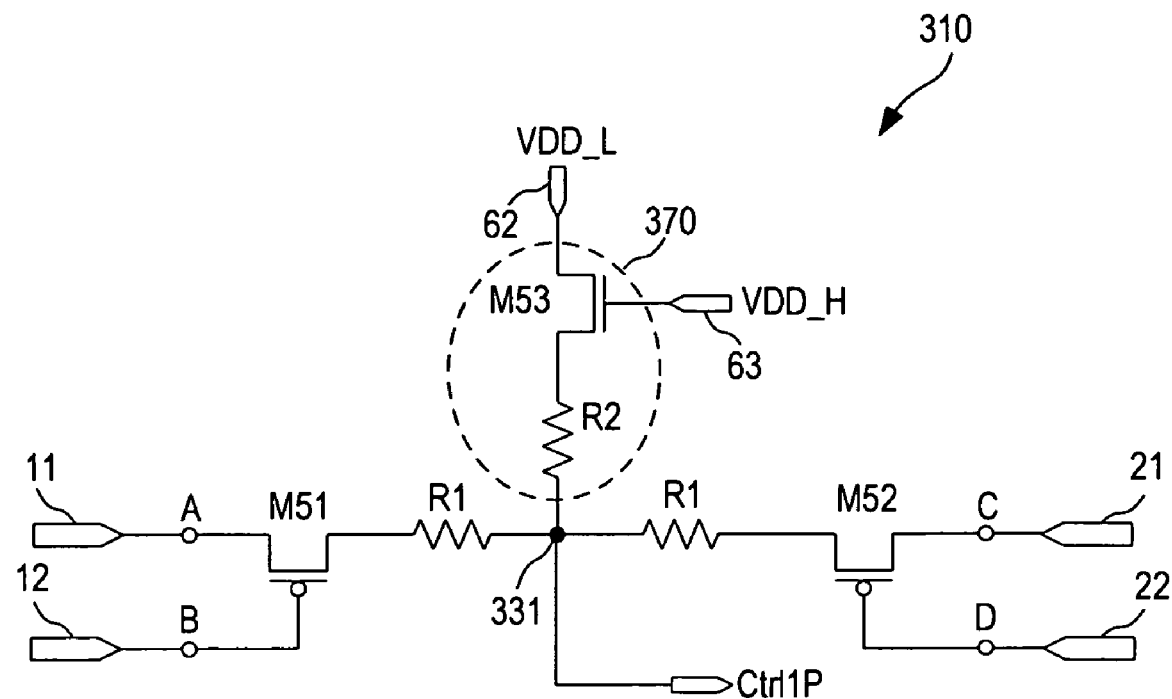
FIG. 8 is a circuit diagram of a first generator circuit of the control signal generator of FIG. 6 according to one embodiment of the present invention.
Figure 8:
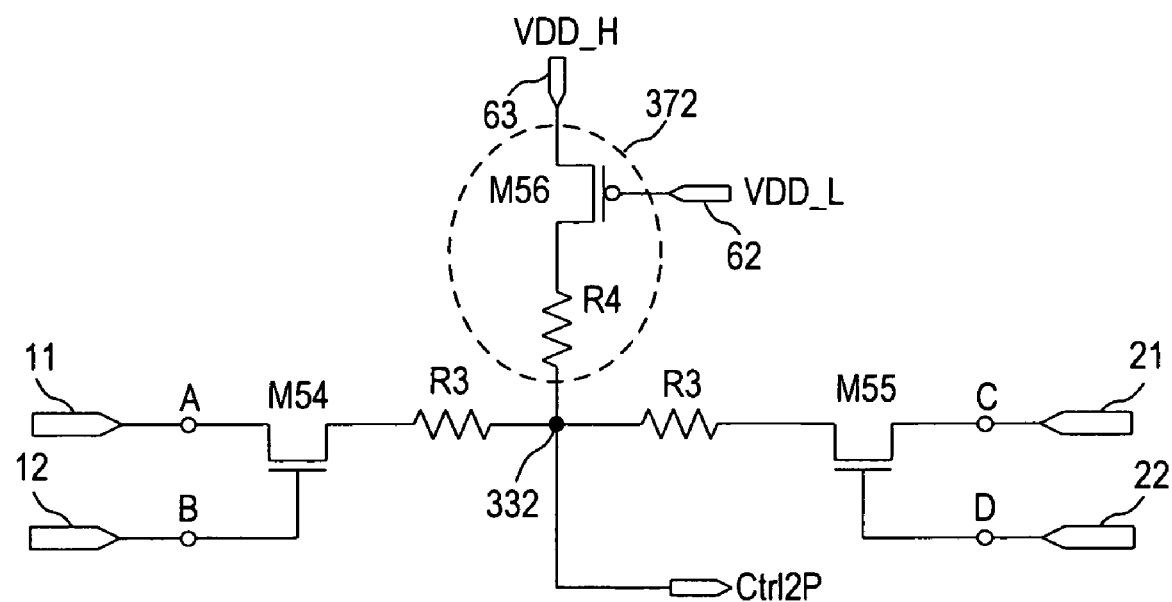
Figure 9:
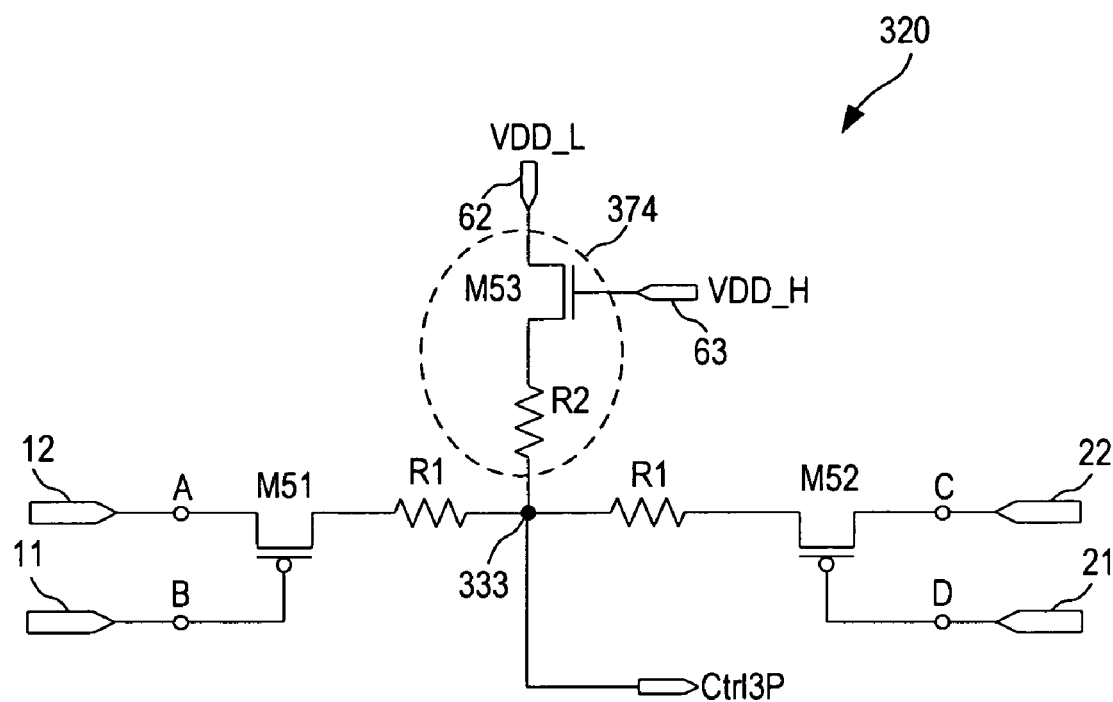
FIG. 9 is a circuit diagram of a second generator circuit of the control signal generator of FIG. 6 according to one embodiment of the present invention.
Figure 9:
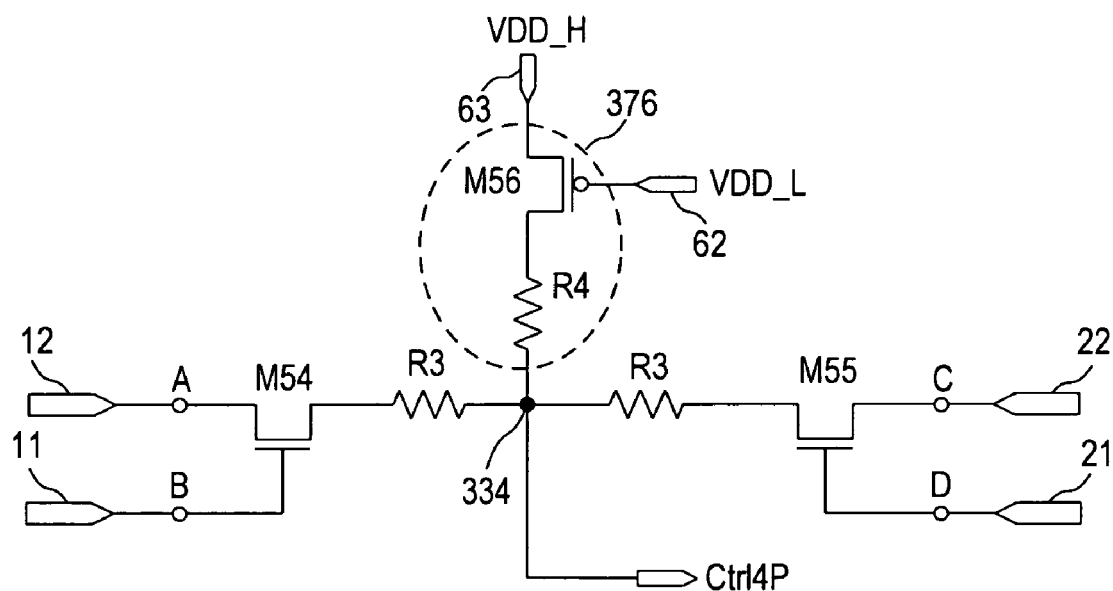

The detail construction of the circuit blocks of control signal generator 300 will now be described. First and second generator circuits 310 and 320 have identical constructions and the detail circuit diagrams are illustrated in FIGS. 7-9. Identical circuit elements are given identical reference numerals to simplify the discussion. In the following description, the construction and operation of only the first generator circuit 310 for generating precursor control signals Ctrl1P and Ctrl2P will be described in detail. It is understood that second generator circuit 320 is constructed and operated in the same manner as first generator circuit 310 to generate the corresponding precursor control signals Ctrl3P and Ctrl4P.

FIG. 7 is a circuit diagram of a Vdd level generator circuit incorporated in control signal generator 300 according to one embodiment of the present invention. Referring to FIG. 7, Vdd level generator circuit 350 is coupled to receive the Vdd voltage (node 60) of the relay switch and generate a VDD_L signal and a VDD_H signal in response. Both the VDD_H and the VDD_L signals have logical low values when the Vdd voltage is less than a predetermined Vdd voltage threshold level. The VDD_H signal has a logical high value while the VDD_L signal has a logical low value when the Vdd voltage is greater than the predetermined Vdd voltage threshold level. The voltage difference between the VDD_H and VDD_L signals are used to drive Vdd control circuits in first and second generator circuits 310 and 320, as will be explained in more detail below. In control signal generator 300, only one instance of Vdd level generator circuit 350 is required to generate the VDD_L and VDD_H signals for both first and second generator circuits 310 and 320. However, in other embodiments, separate Vdd level generator circuits can be provided for each of first and second generator circuits 310 and 320.

In Vdd level generator circuit 350, the Vdd voltage (node 60) is coupled to the drain terminal of a PMOS transistor M59. The gate terminal of transistor M59 is connected to the ground potential. The source terminal (node 63) of transistor M59 is the VDD_H signal. A resistor R59 is connected between the source terminal of transistor M59 and the ground potential. The VDD_H signal on node 63 is coupled to an inverter formed by serially connected PMOS transistor M57 and NMOS transistor M58. The VDD_L signal is generated at the output node 62 of the inverter.

Transistor M59 and resistor R59 in Vdd level generator circuit 350 set the threshold level for indicating a valid Vdd voltage. More specifically, the transistor threshold voltage $V_T$ of transistor M59 and the voltage divider ratio established by transistor M59 and resistor R59 set the predetermined Vdd voltage threshold level for indicating a valid Vdd voltage. One of ordinary skill in the art would appreciate that other circuit arrangement can be used to select a different threshold level for indicating a valid Vdd voltage.

In operation, when the Vdd voltage at node 60 is less than the transistor threshold voltage ($V_T$) of transistor M59, transistor M59 is not turned on and the VDD_H signal is pulled low by resistor R59. The VDD_L signal also remains at a logical low level since there is no sufficient Vdd voltage at the inverter circuit. When both the VDD_H and the VDD_L signals are at the logical "low" levels, the Vdd level generator circuit will not activate the subsequent circuitry in the first and second generator circuits 310 and 320, as will be explained in more detail below.

When the Vdd voltage at node 60 is equal to or greater than the transistor threshold voltage of transistor M59, transistor M59 is turned on and starts to conduct. Thus, transistor M59 and resistor R59 form a voltage divider for the Vdd voltage. The voltage level of the VDD_H signal is thus a fraction of the Vdd voltage. When the VDD_H signal has a voltage level sufficient to trigger the inverter formed by transistors M57 and M58, the inverter is activated and the VDD_L signal is forced to the ground potential through transistor M58. The voltage difference between the VDD_H signal and the VDD_L will be used by Vdd control circuits in the first and second generator circuits to generate control signals in response to the Vdd voltage level, as will be explained in more detail below.

FIG. 8 is a circuit diagram of first generator circuit 310 of control signal generator 300 according to one embodiment of the present invention. FIG. 9 is a circuit diagram of second generator circuit 320 of control signal generator 300 according to one embodiment of the present invention. As can be observed from FIGS. 8 and 9, the construction of the first and second generator circuits is identical and the circuits differ only with respect to the arrangement of input signals connected to ports A, B, C and D and the control signals generated there from. Therefore, only first generator circuit 310 will be described in detail below and second generator circuit 320 will only be described in brief. It is understood that second generator circuit 320 is constructed and operates in the same manner as first generator circuit 310.

Referring to FIG. 8, first generator circuit 310 includes a first circuit portion for generating precursor control signal Ctrl1P and a second circuit portion for generating the complementary precursor control signal Ctrl2P. Because control signals Ctrl1P and Ctrl2P are complementary, first generator circuit 310 operates to generate actively only one of the two control signals while the other complementary control signal is generated passively using a latch circuit, as will be explained in more detail below.

Referring to FIG. 9, second generator circuit 320 includes a first circuit portion for generating precursor control signal Ctrl3P and a second circuit portion for generating the complementary precursor control signal Ctrl4P. Again, because control signals Ctrl3P and Ctrl4P are complementary, second generator circuit 320 operates to generate actively only one of the two control signals while the other complementary control signal is generated passively using a latch circuit.

Because control signal generator 300 has to operate under conditions of no power supply, the control signal generator includes positive wave selectors similar to that incorporated in energy detect circuit 200 to accumulate power for its operation. Returning to FIG. 8, in the first circuit portion of first generator circuit 310, PMOS transistor M51 and PMOS transistor M52 form a positive wave selector for accumulating energy from respective wires 11 and 12, and wires 21 and 22 in a first polarity. Specifically, PMOS transistor M51 has a drain terminal coupled to wire 11 and a gate terminal coupled to wire 12 while PMOS transistor M52 has a drain terminal coupled to wire 21 and a gate terminal coupled to wire 22. As thus configured, PMOS transistors M51 and M52 will accumulate positive-going waves appearing on wires 11 and 21. The voltages appearing on the source terminals of transistors M51 and M52 are converted to currents by resistors R1 and supplied to node 331.

In the second circuit portion of first generator circuit 310, NMOS transistor M54 and NMOS transistor M55 form a positive wave selector for accumulating energy from respective wires 11 and 12, and 21 and 22 in a second, opposite polarity. Specifically, NMOS transistor M54 has a drain terminal coupled to wire 11 and a gate terminal coupled to wire 12 while NMOS transistor M55 has a drain terminal coupled to wire 21 and a gate terminal coupled to wire 22. As thus configured, NMOS transistors M54 and M55 will accumulate negative-going waves appearing on wires 11 and 21. The voltages appearing on the source terminals of transistors M54 and M55 are converted to currents by resistors R3 and supplied to node 332.

The positive wave selectors formed by transistors M51, M52, M54 and M55 accumulate energy from the incoming signals to support the operation of first generator circuit 310. Similar positive wave selectors are included in second generator circuit 320 to accumulate energy from the incoming signals to support the operation of the second generator circuit.

Nodes 331 and 332 are the main control nodes of the first generator circuit 310. The main control nodes driven in a manner to respond to the Vdd voltage level. In the present embodiment, main control node 331 in the first circuit portion is driven by a Vdd control circuit 370 while main control node 332 in the second circuit portion is driven by a Vdd control circuit 372. As shown in FIG. 6 and will be explained in more detail below, main control nodes 331 and 332 are also driven by first energy detect control circuit 360 and second energy detect control circuit 362 to cause the precursor control signals to respond to the energy detect signals.

In the first circuit portion of first generator circuit 310, Vdd control circuit 370 includes an NMOS transistor M53 having its source terminal coupled to the VDD_L signal and its gate terminal coupled to the VDD_H signal. Thus, when the VDD_H voltage is greater than the VDD_L voltage by the transistor threshold voltage ($V_T$) of NMOS transistor M53, transistor M53 is turned on and the logical low level of the VDD_L signal will pass through transistor M53 to a resistor R2 coupled to the drain terminal of transistor M53. Resistor R2 turns the voltage value of the VDD_L signal into a current for driving main control node 331. Main control node 331, which provides the precursor control signal Ctrl1P, is thus driven to the ground potential.

In the second circuit portion, Vdd control circuit 372 includes a PMOS transistor M56 having its source terminal coupled to the VDD_H signal and its gate terminal coupled to the VDD_L signal. Thus, when the VDD_H voltage is greater than the VDD_L voltage by the transistor threshold voltage ($V_T$) of PMOS transistor M56, transistor M56 is turned on and the logical high level of the VDD_H signal will pass through transistor M56 to a resistor R4 coupled to the drain terminal of transistor M56. Resistor R4 turns the voltage value of the VDD_H signal into a current for driving main control node 332. Main control node 332, which provides the precursor control signal Ctrl2P, is thus driven to a logical high level.

Referring to FIG. 9, Vdd control circuits 374 and 376 operate in the same manner as described above to drive main control node 333 and 334 for providing the precursor control signals Ctrl3P and Ctrl4P. Furthermore, precursor control signals Ctrl1P, Ctrl2P, Ctrl3P and Ctrl4P are in fact identical to the final control signals Ctrl1, Ctrl2, Ctrl3 and Ctrl4 with the final control signals having their voltage levels reinforced by the latch circuits.

By reference back to FIG. 4, when control signals Ctrl1 and Ctrl2 having respective low and high logical levels in response to a valid Vdd voltage are used to drive the conduction paths connecting wires 12 and 22, the conduction paths of transistors M25-M28 will be open and no transmission between wires 12 and 22 occurs. Control signals Ctrl3 and Ctrl4, generated by second generator circuit 320 in the same manner as first generator circuit 310, will also operate to open up the conduction paths of transistors M21 to M24 in response to a valid Vdd signal. Therefore, in response to a valid Vdd voltage, main switch 100 is open. Furthermore, the state of the control signals Ctrl1 to Ctrl4 will cause transistors M29 to M32 forming the shunting paths to turn on to shunt the respective conduction path to the Vdd voltage or to ground. Isolation of the first and second data ports when main switch 100 is open is thus achieved.

Returning to FIG. 8, Vdd control circuits 370 and 372 provide an overriding control of the main control nodes 331 and 332. That is, when a valid Vdd voltage is detected, Vdd control circuits 370 and 372 will drive main control nodes 331 and 332 to the respective state to cause the relay switch to open, regardless of the control provided by other control circuits, such as the energy detect control circuits 306 and 362 (FIG. 6). When there is no Vdd voltage or the Vdd voltage is below the valid level, Vdd control circuits 370 and 372 will be disabled and will not drive the respective main control nodes 331 and 332. Instead, the state of the precursor control signals will then be determined by energy detect control circuits 360 and 362.

Returning to FIG. 6, the precursor control signals Ctrl1P, Ctrl2P, Ctrl3P and Ctrl4P on nodes 331 to 334 generated by first and second generator circuits 310, 320 are further driven by first and second energy detect control circuits 360 and 362. In operation, energy detect circuit 360, responsive to first energy detect signal ED1, will drive control signals Ctrl1P and Ctrl3P (main control nodes 331 and 333) to a logical low level and control signals Ctrl2P and Ctrl4P (main control nodes 332 and 334) to a logical high level when first energy detect signal ED1 indicates the detection of a high energy level on wires 11 and 12. On the other hand, energy detect circuit 362, responsive to second energy detect signal ED2, will drive control signals Ctrl1P and Ctrl3P (main control nodes 331 and 333) to a logical low level and control signals Ctrl2P and Ctrl4P (main control nodes 332 and 334) to a logical high level when second energy detect signal ED2 indicates detection of a high energy level on wires 21 and 22.

Thus, when there is no Vdd voltage and a high energy level is detected in the incoming signals on either data port of the relay switch, main switch 100 is open and no conduction occurs between wires 11, 12 and wires 21 and 22. Note that even for incoming signals with high pulse density, it will take a certain amount of time for the energy detect capacitor C31 (FIG. 5) to be charged up to indicate a high energy level. Therefore, the relay switch will pass a portion of the incoming data signals before the relay switch is open. Because any data signals that got passed through are merely partial data packet, the passed-through data signals are treated as invalid data and will be ignored by the network device receiving them and will not be retransmitted.

On the other hand, when there is no Vdd voltage and a low energy level is detected in the incoming signals on either data port of the relay switch, energy detect control circuits 360 and 362 will not drive any of the main control nodes. Instead, the state of the precursor control signals will be determined by the data signals on wires 11, 12, 21 and 22, as will be described in more detail below.

Figure 10:
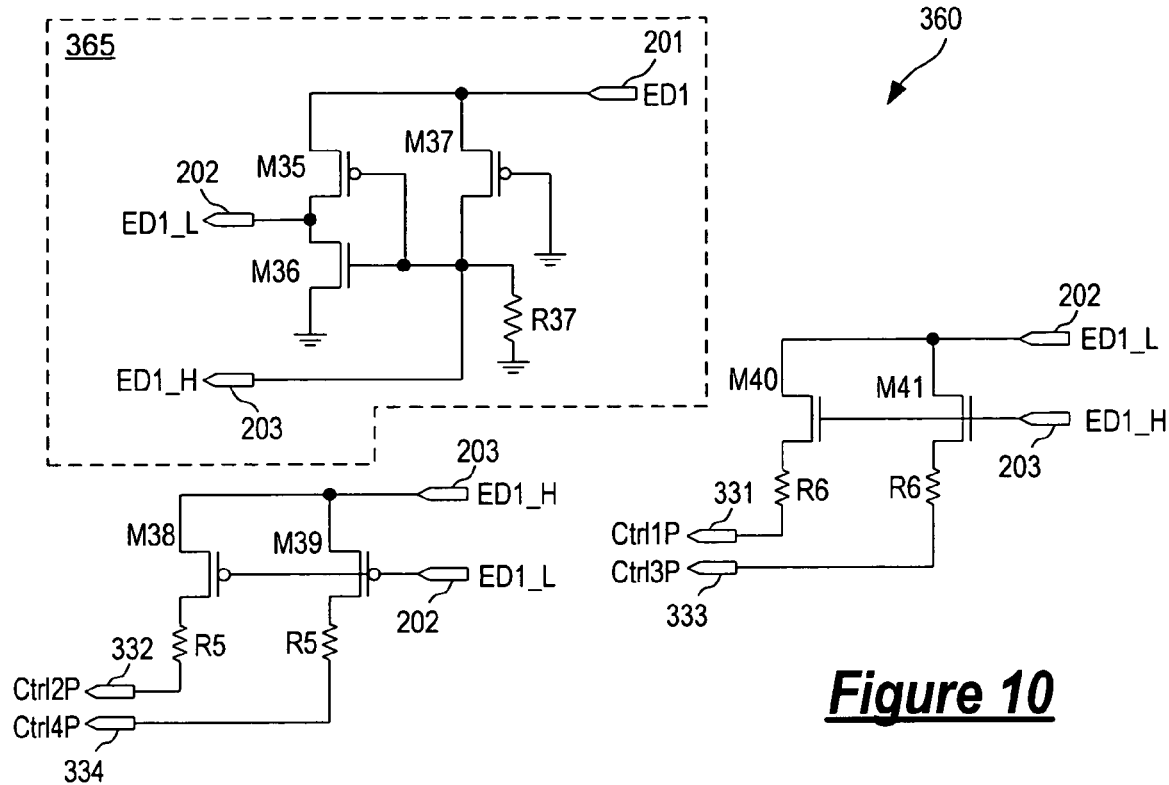
FIG. 10 is a circuit diagram of the energy detect control circuit 1 of FIG. 6 according to one embodiment of the present invention.
Figure 11:
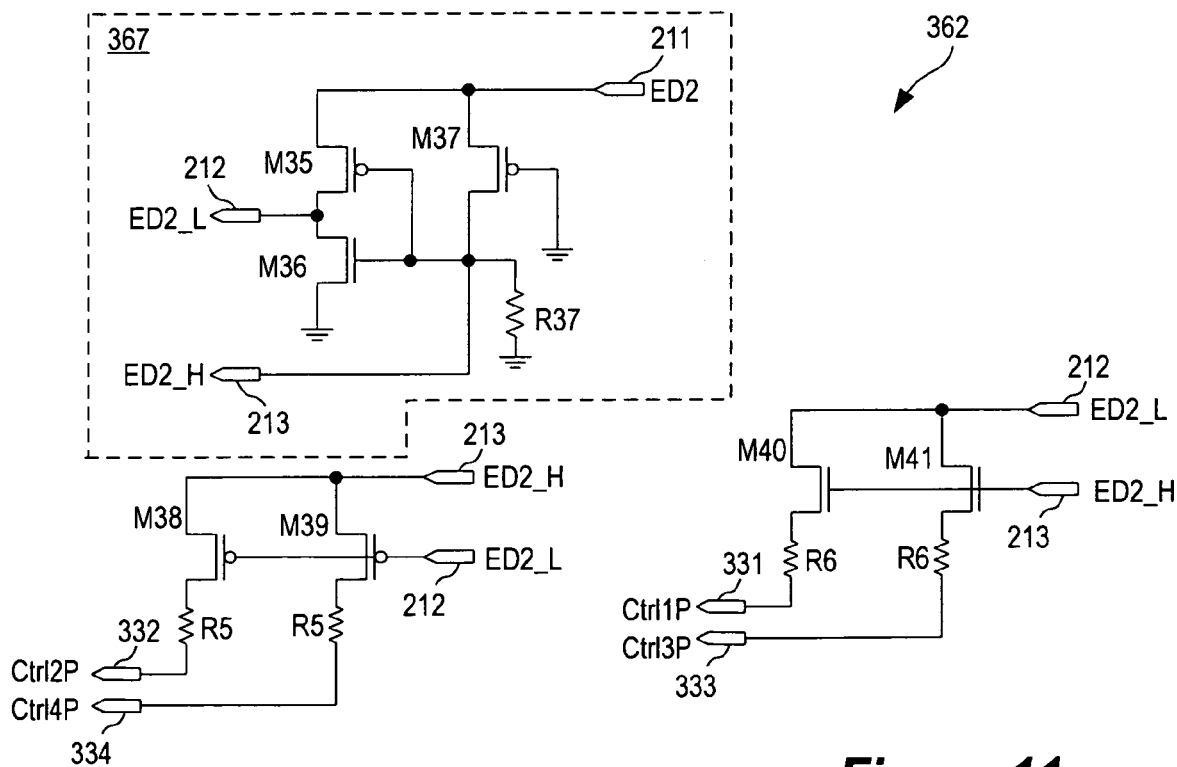
FIG. 11 is a circuit diagram of the energy detect control circuit 2 of FIG. 6 according to one embodiment of the present invention.

FIG. 10 is a circuit diagram of energy detect control circuit 360 of FIG. 6 according to one embodiment of the present invention. FIG. 11 is a circuit diagram of energy detect control circuit 362 of FIG. 6 according to one embodiment of the present invention. Note that circuit 360 of FIG. 10 and circuit 362 of FIG. 11 have identical constructions except for the input signals (ED1 or ED2) coupled thereto and the output signals generated there from. Description of only energy detect control circuit 360 in FIG. 10 will be provided below and one of ordinary skill in the art would appreciate that energy detect control circuit 362 is constructed and operated in the same manner as energy detect control circuit 360.

Referring to FIG. 10, energy detect control circuit 360 receives first energy detect signal ED1 as an input signal (node 201). An energy level generator circuit 365 is coupled to receive first energy detect signal ED1 and generates an ED1_L signal and an ED1_H signal in response. It can be observed that energy level generator circuit 365 is constructed in the same manner as Vdd level generator circuit 350 of FIG. 7. Specifically, circuit 365 includes a PMOS transistor M37 and a resistor R27 connected in series between node 201 receiving the ED1 signal and the ground potential. The common node 203 between transistor M37 and resistor R37 is the ED1_H signal. The gate terminal of transistor M37 is connected to the ground potential. The ED1_H signal on node 203 is coupled to an inverter formed by serially connected PMOS transistor M35 and NMOS transistor M36. The ED1_L signal is generated at the output node 202 of the inverter.

Transistor M37 and resistor R37 in energy level generator circuit 365 set the energy threshold level for indicating a high energy level. More specifically, the transistor threshold voltage $V_T$ of transistor M37 and the voltage divider ratio established by transistor M37 and resistor R37 set the predetermined energy threshold level for indicating a high energy level. One of ordinary skill in the art would appreciate that other circuit arrangement can be used to select a different energy threshold level for indicating a high energy level.

The operation of energy level generator circuit 365 is identical to Vdd level generator circuit 350. Basically, ED1_H signal has a logical high value and ED1_L signal has a logical low value when signal ED1 is at a logical high level. Alternately, both ED1_H and ED1_L signals have logical low values when signal ED1 is at a logical low level.

In energy detect control circuit 360, the ED1_L and ED1_H signals are coupled to separate positive wave selector circuits to generate the corresponding control signals for driving the main control nodes 331-334 of the control signal generator circuits. First, PMOS transistors M38 and M39 are connected in parallel to receive the ED1_H signal at the drain terminals and the ED1_L signal at the gate terminals. Thus, when first energy detect signal ED1 is at a logical high, indicative of a high energy level, transistors M38 and M39 are turned on to pass the ED1_H signal to respective resistors R5. Precursor control signals Ctrl2P and Ctrl4P are thus driven to a logical high level. At the same time, NMOS transistors M40 and M41 are connected in parallel to receive the ED1_L signal at the drain terminals and the ED1_H signal at the gate terminals. Thus, when first energy detect signal ED1 is at a logical high, indicative of a high energy level, transistors M40 and M41 are turned on to pass the ED1_L signal to respective resistors R6. Precursor control signals Ctrl1P and Ctrl3P are thus driven to a logical low level.

As thus operated, energy detect control circuit 360 drives precursor control signals Ctrl1P and Ctrl3P to a logical low level and precursor control signals Ctrl2P and Ctrl4P to a logical high level when the first energy detect signal ED1 indicates a high energy level on wires 11 and 12. The final control signals Ctrl1, Ctrl2, Ctrl3 and Ctrl4 will have the same logical states as the precursor control signals. By reference to FIG. 4, the logical states of the control signals cause the conduction paths of the main switch to open. Therefore, the relay switch of the present invention is open and isolate the first and second data ports when the Vdd voltage is absent and a high energy level is detected in the incoming signals. Energy detect control circuit 360 is disabled when energy detect signal ED1 is at a logical low level indicative of a low energy level, thereby leaving the main control nodes 331-334 undriven by the energy detect control circuit.

Energy detect control circuit 362 of FIG. 11 operates in the same manner as described above to drive precursor control signals Ctrl1P to Ctrl4P in response to second energy detect signal ED2 indicative of the energy level of the incoming signals on wires 21 and 22.

Referring to FIGS. 4 and 6-11, the control signal generator 300 forces control signals Ctrl1 and Ctrl3 to a logical low state and control signals Ctrl2 and Ctrl4 to a logical high state to open the relay switch in response to a valid Vdd voltage level and to a high energy level detected in the incoming signals. In the absence of a valid Vdd voltage and in the absence of a high detected energy level, the Vdd control circuits and the energy detect control circuits are no longer driving the main control nodes 331-334 of control signal generator 300. Instead, control signal generator 300 generates the final control signals Ctrl1 to Ctrl4 using the positive wave selectors of transistors M51, M52, M54, M55 in each of first generator circuit 310 and second generator circuit 320.

Referring first to FIGS. 6 and 8, when main control nodes 331 and 332 are not driven by any of the Vdd control circuits 370, 372, energy detect control circuits 360 and 362, the main control nodes are driven entirely by the energy accumulated through transistors M51, M52, M54 and M55. First, assume that incoming signals are arriving on wires 11 and 12 associated with the first data port. When the signal on wire 11 has a logical high value, the signal on wire 12, being a differential signal, has a logical low value. Thus, PMOS transistor M51 is turned on and the logical high value on wire 11 passes through resistor R1 to drive main control node 331 (Ctrl1P) to a logical high level. Meanwhile, NMOS transistor M54 is turned off and main control node 332 (Ctrl2P) is not driven. Now, when the signal on wire 11 has a logical low value, the signal on wire 12, being a differential signal, has a logical high value. Thus, PMOS transistor M54 is turned on and the logical low value on wire 11 passes through resistor R3 to drive main control node 332 (Ctrl2P) to a logical low level. Meanwhile, NMOS transistor M51 is turned off and main control node 321 (Ctrl1P) is not driven.

As thus configured, when control signals Ctrl1P and Ctrl2P are driven entirely by the incoming pulses from the data ports, only one of the two precursor control signals will be actively generated. It is also apparent that the same result is obtained in first generator circuit 310 when incoming signals arrive on wires 21 and 22 of the second data port. Furthermore, the same analysis applies to second generator circuit 320 (FIG. 9) where only one of precursor control signals Ctrl3P and Ctrl4P will be actively generated when the control signals are driven entirely from the data ports.

However, because control signals Ctrl1P and Ctrl2P belong to a complementary pair and control signals Ctrl3P and Ctrl4P belong to a complementary pair, when one control signal in the pair is actively generated, the other complementary control signal can be generated passively from the complementary control signal through feedback. In accordance with the present embodiment of the present invention, latch circuits 620, 640 (FIG. 6) are used to force one control signal of the pair to a first logical state when the other control signal of the pair is actively forced to a second, complementary logical state by the first and second generator circuits. In this manner, all the conduction paths of the main conduction switch circuit can be turned on properly to provide signal transmission without attenuation.

Figure 12:
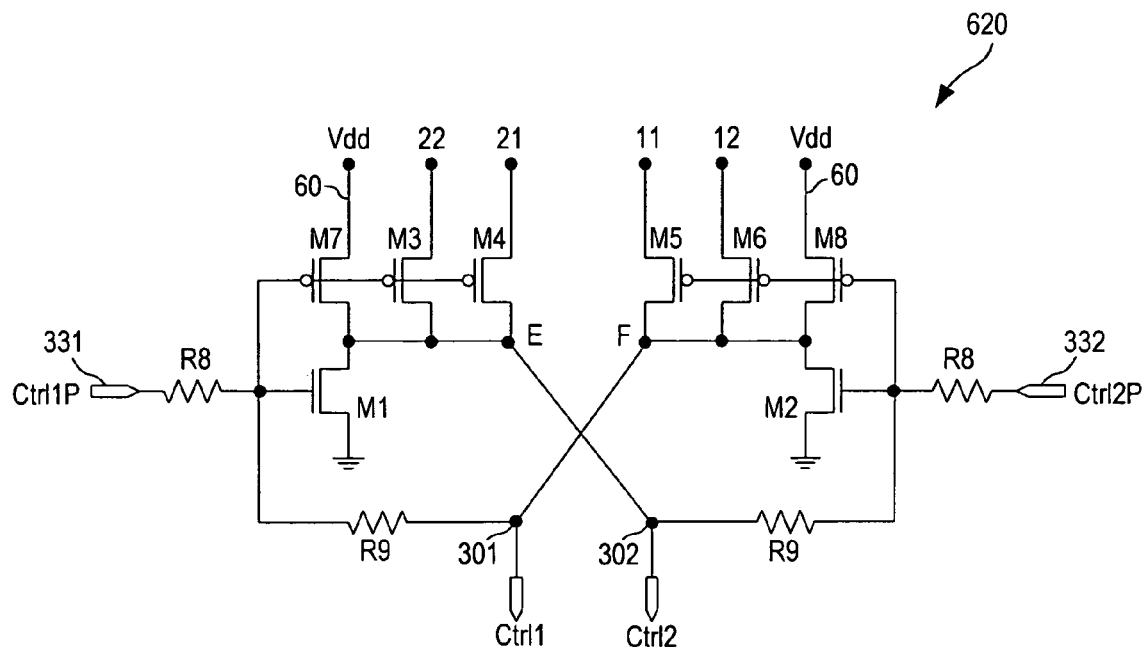
FIG. 12 is a circuit diagram of a first latch circuit which can be incorporated in the control signal generator of FIG. 6 according to one embodiment of the present invention.
Figure 13:
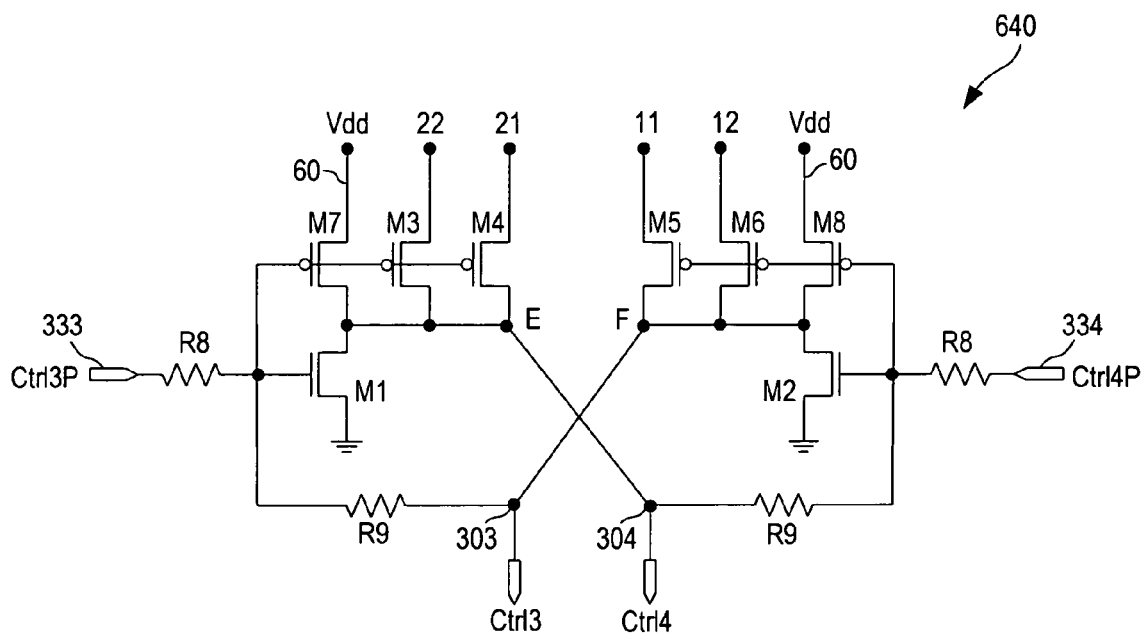
FIG. 13 is a circuit diagram of a second latch circuit which can be incorporated in the control signal generator of FIG. 6 according to one embodiment of the present invention.

As described above, each of first and second latch circuits 620, 640 operates through feedback to reinforce the signal levels of the precursor control signals to generate final control signals Ctrl1, Ctrl2, Ctrl3 and Ctrl4 having the desired voltage levels. FIG. 12 is a circuit diagram of first latch circuit 620 which can be used incorporated in control signal generator 300 of FIG. 6 according to one embodiment of the present invention. FIG. 13 is a circuit diagram of second latch circuit 640 which can be incorporated in the control signal generator 300 of FIG. 6 according to one embodiment of the present invention. Referring to FIGS. 12 and 13, first latch circuit 620 operates through feedback to generate a final control signal in the complementary pair of control signals Ctrl1 and Ctrl2 while second latch circuit 640 operate through feedback to generate a final control signal in the complementary pair of control signals Ctrl3 and Ctrl4. The construction and operation of first and second latch circuits 620 and 640 are identical except for the input and output signals. Therefore, the following description refers only to the first latch circuit 620.

Referring to FIG. 12, latch circuit 620 includes a PMOS transistor M3 connected between wire 22 and a node E, a PMOS transistor M4 connected between wire 21 and node E, a PMOS transistor M7 connected between the Vdd voltage (node 60) and node E, and an NMOS transistor M1 connected between node E and the ground potential. The gate terminals of transistors M1, M3, M4 and M7 are all coupled to receive precursor control signal Ctrl1P through a resistor R8. Latch circuit 620 further includes a PMOS transistor M5 connected between wire 11 and a node F, a PMOS transistor M6 connected between wire 12 and node F, a PMOS transistor M8 connected between the Vdd voltage and node F, and an NMOS transistor M2 connected between node F and the ground potential. The gate terminals of transistors M2, M5, M6 and M8 are all coupled to receive precursor control signal Ctrl2P through a resistor R8. Node E (also node 302) is cross-coupled to connect through resistor R9 to the gate terminals of transistors M2, M5, M6 and M8 while node F (also node 301) is cross-coupled to connect through resistor R9 to the gate terminals of transistors M1, M3, M4 and M7.

In operation, assume that wire 11 is at a logical high level and wire 12 is therefore at a logical low level, control signal Ctrl1P is driven to a logical high value by first generator circuit 310 (FIG. 8). The logical high value of control signal Ctrl1P turns on transistor M1 which drives node E to the ground potential. Because node E is control signal Ctrl2, final control signal Ctrl2 is thereby being driven to a logical low level, which is the complementary state of control signal Ctrol1P. Meanwhile, the logical low value at control signal Ctrl2 is coupled through resistor R9 to turns on transistor M5. Control signal Ctrl1 at node F is therefore driven to the logical high value of wire 11. The logical high value of wire 11 is thus coupled back to reinforce the logical high value of final control signal Ctrl1. As thus operated, final control signal Ctrl1 have the same logical value as precursor control signal Ctrl1P but with boosted signal level or boosted voltage value. Final control signal Ctrl2 is forced to a logical state opposite to the final control signal Ctrl1 and is also driven to a boosted signal level or boosted voltage value.

One of ordinary skill in the art, upon inspection of first latch circuit 620 (FIG. 12) and second latch circuit 640 (FIG. 13), would appreciate that the latch circuits operate in the manner describe above to drive the one control signal of a complementary pair to a complementary state when the other control signal is actively generated by the first and second generator circuits. The advantage of first and second latch circuits 620, 640 is that the final control signals are driven very close to the data signal values on the data ports. As can be observed from the circuit diagrams of FIGS. 12 and 13, the final control signals Ctrl1 to Ctrl4 on nodes 301 to 304 are only one transistor away from the wires of the data ports and the Vdd voltage. The final control signals Ctrl1 to Ctrl4 can thus be driven very close to the voltage levels at the data ports or the Vdd node. The resulting control signals Ctrl1 to Ctrl4 can thus have stronger signal strength.

In first and second latch circuits 620, 640, a resistor R9 is inserted between the final control signal node (E or F) and the precursor control signal (through resistor R8). Resistor R9 is included to allow certain signal to assert influence and control over a node based on the voltage divider principle. For instance, in first and second latch circuits 620, 640, resistor R9 is incorporated to weaken the control of precursor control signals Ctrl1P to Ctrl4P over respective nodes 301 to 304 and thereby allowing the final control signals Ctrl1 to Ctrl4 on nodes 301 to 304 to be regenerated by the latch circuits. When final control signals Ctrl1 to Ctrl4 are thus regenerated, the control signals will have strong voltage levels without appreciable attenuation.

Figure 14:
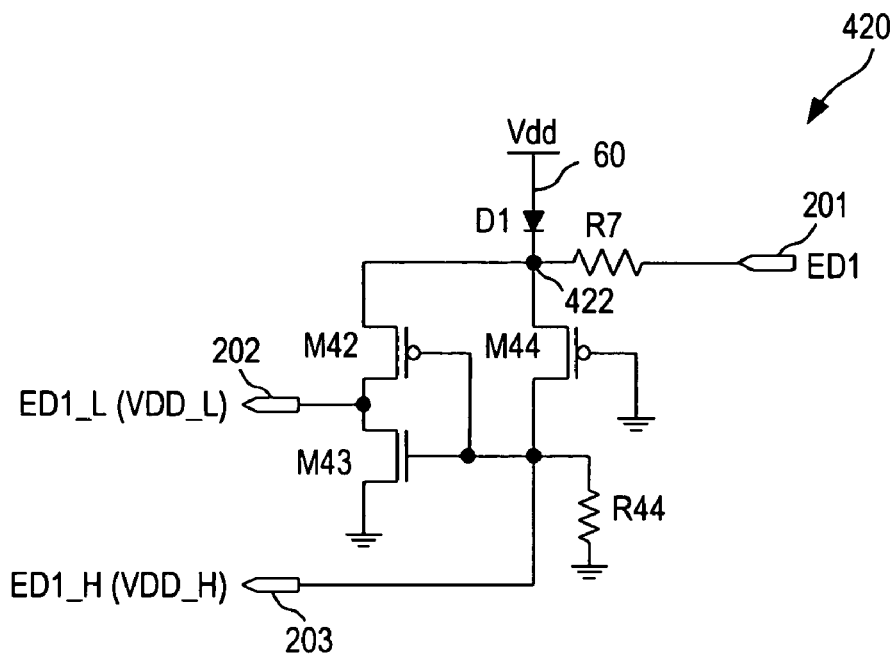
FIG. 14 is a circuit diagram of a first Vdd/energy detect control circuit according to one embodiment of the present invention.
Figure 15:
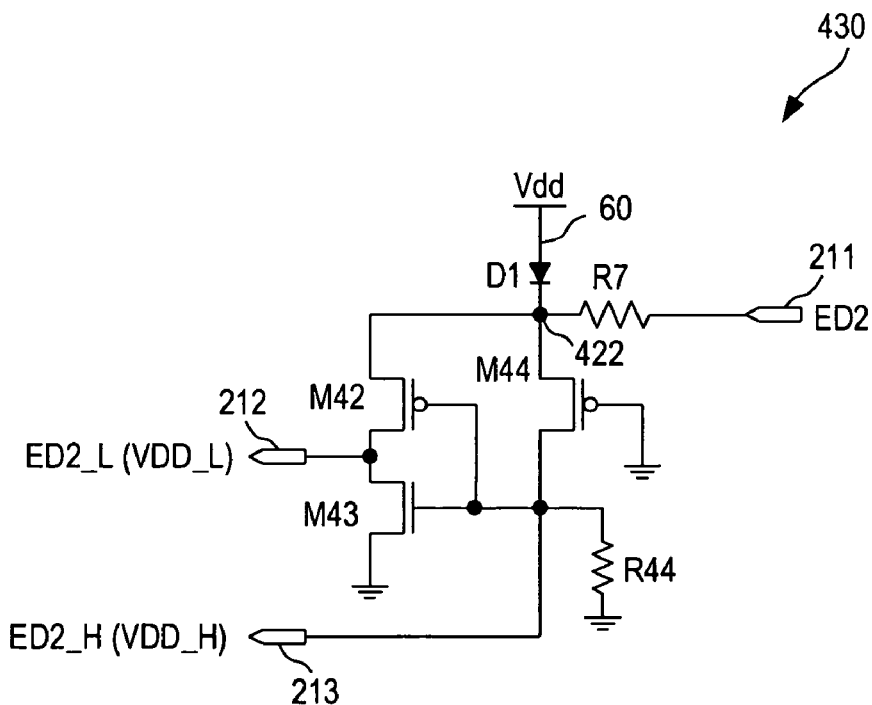
FIG. 15 is a circuit diagram of a second Vdd/energy detect control circuit according to one embodiment of the present invention.

In the above-described embodiment, control signal generator 300 includes separate Vdd control circuit and energy detect control circuits. According to an alternate embodiment of the present invention, the Vdd control circuit is merged into each of the first and second energy detect control circuits to simplify the control of the main control nodes. FIG. 14 is a circuit diagram of a first Vdd/energy detect control circuit according to one embodiment of the present invention. FIG. 15 is a circuit diagram of a second Vdd/energy detect control circuit according to one embodiment of the present invention. By using the first and second Vdd/energy detect control circuits, Vdd control circuits 370, 372, 374 and 376 (FIGS. 8 and 9) in the first and second generator circuits 310, 320 can be eliminated. Instead, first and second energy detect control circuits 360, 362 (FIG. 6) can be modified to include first and second Vdd/energy detect control circuits of FIGS. 14 and 15, as will be described in more detail below. The operation of control signal generator 300 remains the same.

Referring to FIG. 14, first Vdd/energy detect control circuit 420 combines the function of the Vdd level generator circuit 350, Vdd control circuit 370, 372 and energy level generator circuit 365 of the energy detect control circuit 360. That is, first Vdd/energy detect control circuit 420 replaces the Vdd level generator circuit (350), the Vdd control circuit (370, 372) and the energy level generator circuit 365 of first energy detect control circuit 360. First Vdd/energy detect control circuit 420 receives the Vdd voltage and the first energy detect signal ED1 to generate a ED1_L(VDD_L) signal and a ED1_H(VDD_H) signal on respective nodes 202 and 203. The ED1_L(VDD_L) signal and the ED1_H(VDD_H) signal are coupled to the remaining circuitry of first energy detect control circuit 360 (FIG. 10) to drive the main control nodes 331 to 334.

Similar operation scheme applies to second Vdd/energy detect control circuit 430 of FIG. 15. Second Vdd/energy detect control circuit 430 replaces the Vdd level generator circuit (350), the Vdd control circuit (374, 376) and the energy level generator circuit 367 of second energy detect control circuit 362. Second Vdd/energy detect control circuit 430 generates a ED2_L(VDD_L) signal and a ED2_H (VDD_H) signal on respective nodes 212 and 213. The ED2_L(VDD_L) signal and the ED2_H(VDD_H) signal are coupled to the remaining circuitry of energy detect control circuit 362 (FIG. 11) to drive the main control nodes 331 to 334.

In first Vdd/energy detect control circuit 420, the Vdd voltage is coupled to the anode of a diode D1 where the cathode is coupled to a node 422. First energy detect signal ED1 is coupled through a resistor R7 also to node 422. Thus, a high level on either the Vdd voltage or the energy detect signal ED1 will cause node 422 to be at a logical high. A PMOS transistor M44, having its gate terminal coupled to the ground potential, is connected between node 422 and node 203 providing the ED1_H(VDD_H) signal. A resistor R44 is connected between node 203 and the ground potential to establish a voltage divider function with transistor M44 for setting the threshold level of the Vdd voltage and the energy level. The ED1_H(VDD_H) signal is coupled to an inverter formed by a PMOS transistor M42 and an NMOS transistor M43 to generate the ED1_L(VDD_L) signals on node 202. Diode D1 is included to prevent the Vdd node from being driven by the energy detect signal.

In operation, when node 422 is at a logical high level, signal ED1_H(VDD_H) is driven high while signal ED1_L (VDD_L) is driven low. The signals ED1_H(VDD_H) and ED1_L(VDD_L) are then coupled to transistors M38, M39, M40 and M41 of energy detect control circuit 360 to drive the main control nodes 331-334. The voltage difference between the ED1_H(VDD_H) signal and the ED1_L(VDD_L) will allow transistors M38 to M41 to drive the precursor control signals so that the conduction paths of the relay switch are turned off, isolating the first and second data ports. On the other hand, when node 422 is at a logical low level, signals ED1_H(VDD_H) and ED1_L(VDD_L) are both driven low. Energy detect control circuit 360 no longer drives the main control nodes.

Second Vdd/energy detect control circuit 430 (FIG. 15) operates in the same manner as first Vdd/energy detect control circuit 420 in response to second energy detect signal ED2.

The relay switch of the present invention provides many advantages over conventional relay switch. First, the relay switch of the present invention incorporates energy detection to enhance the relay operation. In essence, the relay switch becomes a "smart" relay when the opening and closing of the switch is merely controlled by the Vdd voltage. Second, the relay switch of the present invention can be advantageously applied in PoE applications where the signal loop back discovery method is used. The relay switch of the present invention allows control pulses to be looped back while preventing data packets to be returned, thereby avoiding jamming when the network device is not a PSE. Thus, the relay switch can be incorporated for use with a Powered Device while avoiding the need for a complicated filter to filter out the loop back signal.

Moreover, the relay switch of the present invention also has applications in the area of Voice over Internet Protocol (VoIP) for 911 dialing. VoIP allows the user to make inexpensive telephone calls over the Internet. But one pitfall of VoIP telephone is that, just like mobile telephones, a VoIP phone will not work if there is no power. The relay switch of the present invention can be applied to a VoIP telephone to detect occurrences of power outages. The relay switch of the present invention can the coupled to turn itself on to connect the VoIP telephone to a regular phone line in the event of a power outage.

In the above description, the terms "source" and "drain" are used to refer to the current handling terminals of a MOS transistor. However, one of ordinary skill in the art would appreciate that the source and drain terminals of a MOS transistor are interchangeable and the reference of a specific terminal as the source or the drain is illustrative only.

The above detailed descriptions are provided to illustrate specific embodiments of the present invention and are not intended to be limiting. Numerous modifications and variations within the scope of the present invention are possible. For example, the above-described embodiments illustrate implementation of the relay switch circuit using MOS transistors. One of ordinary skill in the art would appreciate that the circuits can be implemented using transistors of opposite polarities as long as the voltage signal polarities are modified accordingly.

Also, the above description describes a control signal generator for generating four control signals as two pairs of complementary signals. The two pairs of complementary signals are used to drive a main conduction switch having two pairs of complementary conduction paths. One of ordinary skill in the art would appreciate that in other embodiments, the control signal generator can generate one or more control signals depending on the construction of the main conduction switch of the relay switch. One of ordinary skill in the art would appreciate that the main conduction switch can be implemented using one or more conduction paths.

Furthermore, the capacitors used in the above-described circuits operate as charge storage devices and other charge storage devices can also be used in place of the capacitors. Also, while the first and second latch circuits 620, 640 provide useful functions in reinforcing the voltage levels of control signals, the latch circuits are optional and may be omitted in other embodiments of the present invention. Additionally, in the above-described embodiments, resistors, such as resistor R34, R8 and R9 are included in various circuits for setting the desired control for the respective nodes. One of ordinary skill in the art would appreciate that the resistors are optional elements and may be omitted in other embodiments of the present invention.

The present invention is defined by the appended claims.

We claim:

1. A relay switch circuit, comprising:
a first data port coupled to a first pair of wires carrying a first pair of differential signals;
a second data port coupled to a second pair of wires carrying a second pair of differential signals;
a power supply terminal receiving a power supply voltage signal;
an energy detect circuit coupled to measure the energy of incoming signals on the first data port and the second data port, the energy detect circuit generating a first energy detect signal and a second energy detect signal indicative of an energy level of the incoming signals on the respective first and second data ports, the first and second energy detect signals having a first state when an energy level exceeding a predetermined threshold is measured on the incoming signals at the respective data port and a second state otherwise;
a control signal generator circuit coupled to receive incoming signals from the first data port and the second data port, the power supply voltage signal, and the first and second energy detect signals and generate one or more control signals in response, the control signal generator deriving power for its operation from the incoming signals; and a switch circuit coupled to the first data port and the second data port and being controlled by the one or more control signals, the switch circuit being operated to open to isolate the first data port from the second data port or close to transmit differential signals onto and receive differential signals from the first and second data ports, wherein the control signal generator generates the one or more control signals to cause the switch circuit to open when the power supply voltage signal indicates a valid power supply voltage and to open when the power supply voltage signal indicates an invalid power supply voltage and one of the first and second energy detect signals has the first state, and the control signal generator generates the one or more control signals to cause the switch circuit to close when the power supply voltage signal indicates an invalid power supply voltage and both of the first and second energy detect signals have the second state.

2. The relay switch circuit of claim 1, wherein the first and second energy detect signals have the first state when the incoming signals comprise signals having a high pulse density and the second state when the incoming signals comprise signals having a low pulse density.

3. The relay switch circuit of claim 1, wherein the switch circuit comprises:

first and second conduction paths connecting a first wire of the first data port to a first wire of the second data port;

third and fourth conduction paths connecting a second wire of the first data port to a second wire of the second data port;

the first conduction path comprising one or more transistors of a first type being controlled by the one or more control signals;

the second conduction path comprising one or more transistors of a second type, opposite to the first type, being controlled by the one or more control signals;

the third conduction path comprising one or more transistors of the first type being controlled by the one or more control signals; and the fourth conduction path comprising one or more transistors of the second type being controlled by the one or more control signals;

wherein the one or more control signals operate to turn on the first, second, third and fourth conduction paths to electrically connect the first data port to the second data port and to turn off the first, second, third and fourth conduction paths to electrically isolate the first data port from the second data port.

4. The relay switch circuit of claim 1, wherein the one or more control signals comprise a plurality of control signals, the switch circuit comprises:

first and second conduction paths connecting a first wire of the first data port to a first wire of the second data port;

third and fourth conduction paths connecting a second wire of the first data port to a second wire of the second data port;

the first conduction path comprising a first NMOS transistor and a second NMOS transistor connected in series between the first wires of the first and second data ports, the first and second NMOS transistors being controlled by a first control signal of the plurality of control signals;

the second conduction path comprising a first PMOS transistor and a second PMOS transistor connected in series between the first wires of the first and second data ports, the first and second PMOS transistors being controlled by a second control signal of the plurality of control signals, the second control signal being complementary to the first control signal;

the third conduction path comprising a third NMOS transistor and a fourth NMOS transistor connected in series between the second wires of the first and second data ports, the third and fourth NMOS transistors being controlled by a third control signal of the plurality of control signals; and the fourth conduction path comprising a third PMOS transistor and a fourth PMOS transistor connected in series between the second wires of the first and second data ports, the third and fourth PMOS transistors being controlled by a fourth control signal of the plurality of control signals, the fourth control signal being complementary to the third control signal, wherein the first and second control signals are complementary signals and the third and fourth control signals are complementary signals operative to turn on the first, second, third and fourth conduction paths to electrically connect the first data port to the second data port and to turn off the first, second, third and fourth conduction paths to electrically isolate the first data port from the second data port.

5. The relay switch of claim 4, wherein the switch circuit further comprises:

a first switch coupled to a node between the first and second NMOS transistors of the first conduction path and the power supply terminal, the first switch being operated in response to the first control signal to shunt the first conduction path to the power supply voltage signal when the first conduction path is turned off by the first control signal;

a second switch coupled to a node between the first and second PMOS transistors of the second conduction path and a ground potential, the second switch being operated in response to the second control signal to shunt the second conduction path to the ground potential when the second conduction path is turned off by the second control signal;

a third switch coupled to a node between the third and fourth NMOS transistors of the third conduction path and the power supply terminal, the third switch being operated in response to the third control signal to shunt the third conduction path to the power supply voltage signal when the third conduction path is turned off by the third control signal; and a fourth switch coupled to a node between the third and fourth PMOS transistors of the fourth conduction path and the ground potential, the fourth switch being operated in response to the fourth control signal to shunt the fourth conduction path to the ground potential when the fourth conduction path is turned off by the fourth control signal.

6. The relay switch circuit of claim 5, wherein the first and third switches each comprises a PMOS transistor and the second and fourth switches each comprises an NMOS transistor.

7. The relay switch circuit of claim 1, wherein the energy detect circuit comprises:

a first detect circuit for measuring the energy of the incoming signals on the first data port and generating the first energy detect signal; and a second detect circuit for measuring the energy of the incoming signals on the second data port and generating the second energy detect signal;

each of the first and second detect circuit comprising:
- a first transistor of a first type having a first current handling terminal coupled to a first wire of the respective first or second data port, a control terminal coupled to a second wire of the respective first or second data port, and a second current handling terminal coupled to a first node;
- a second transistor of the first type having a first current handling terminal coupled to the second wire of the respective first or second data port, a control terminal coupled to the first wire of the respective first or second data port, and a second current handling terminal coupled to a second node;
- a first resistor coupled between the first node and an output node;
- a second resistor coupled between the second node and the output node;
- a third resistor coupled between the output node and a ground potential; and
- a capacitor coupled between the output node and the ground potential, the respective first or second energy detect signal being generated at the output node,
- wherein the resistance values of the first, second, and third resistors and the capacitance value of the capacitor are selected to establish a time constant for the respective first and second detect circuit, the time constant being selected to allow the capacitor to collect charge when the incoming signals have a high pulse density, the high pulse density being indicative of a high energy level in the incoming signals.

8. The relay switch circuit of claim 1, wherein the one or more control signals comprise a plurality of control signals, the plurality of control signals comprising one or more pairs of complementary control signals, the control signal generator circuit comprises:
- a first generator circuit coupled to receive the incoming data signals from the first and second data ports and the power supply voltage signal, the first generator circuit generating a first pair of complementary precursor control signals on respective first and second main control nodes;
- a second generator circuit coupled to receive the incoming data signals from the first and second data ports and the power supply voltage signal, the second generator circuit generating a second pair of complementary precursor control signals on respective third and fourth main control nodes;
- a first energy detect control circuit coupled to receive the first energy detect signal and coupled to drive the first, second, third and fourth main control nodes to cause the switch circuit to open when the first energy detect signal has the first state; and
- a second energy detect control circuit coupled to receive the second energy detect signal and coupled to drive the first, second, third and fourth main control nodes to cause the switch circuit to open when the second energy detect signal has the first state,
- wherein the first pair of complementary precursor control signals and the second pair of complementary precursor control signals correspond to a first pair of complementary control signals and a second pair of complementary control signals, respectively.

9. The relay switch circuit of claim 8, wherein the first and second generator circuits comprise:
- a plurality of positive wave selectors, a first group of positive wave selectors being coupled to accumulate energy from positive-going or negative-going waves of incoming signals from the first data port, a second group of positive wave selectors being coupled to accumulate energy from positive-going or negative-going waves of incoming signals from the second data port;
- each of the first, second, third and fourth main control nodes being coupled to receive energy from a positive wave selector from the first group and a positive wave selector from the second group, each main control node generating one precursor control signal of the first and second pairs of complementary precursor control signals; and
- a plurality of power supply control circuits each associated with one of the first, second, third and fourth main control nodes, each power supply control circuit being coupled to receive the power supply voltage signal and coupled to drive the associated main control node to a logical state for causing the switch circuit to open when the power supply voltage signal indicates a valid power supply voltage.

10. The relay switch circuit of claim 8, wherein the control signal generator circuit further comprises a plurality of latch circuits coupled to the first, second, third and fourth main control nodes, the plurality of latch circuits receiving the first and second pairs of complementary precursor control signals and generating the first and second pairs of complementary control signals, wherein when a first precursor control signal in the first pair of complementary precursor control signals is being driven to a first state, an associated latch circuit is coupled to drive a second control signal in the first pair of complementary control signal to a second state, complementary to the first state.

11. The relay switch circuit of claim 8, wherein the control signal generator circuit further comprises:
- a first latch circuit coupled to receive the first pair of complementary precursor control signals, the incoming data signals from the first and second data ports, and the power supply voltage signal, the first latch circuit generating the first pair of complementary control signals having the same logical state as the first pair of complementary precursor control signals and having boosted voltage values; and
- a second latch circuit coupled to receive the second pair of complementary precursor control signals, the incoming data signals from the first and second data ports, and the power supply voltage signal, the second latch circuit generating the second pair of complementary control signals having the same logical state as the second pair of complementary precursor control signals and having boosted voltage values,
- wherein the first and second generator circuits generate at least one precursor control signal in a pair of complementary precursor control signals, the first and second latch circuits operate to drive the control signal corresponding to the other precursor control signal in the pair of complementary precursor control signals to a complementary state.

12. The relay switch circuit of claim 1, wherein the one or more control signals comprise a plurality of control signals, the plurality of control signals comprising one or more pairs of complementary control signals, the control signal generator circuit comprises:
- a first generator circuit coupled to receive the incoming data signals from the first and second data ports and the power supply voltage signal, the first generator circuit generating a first pair of complementary precursor control signals on respective first and second main control nodes;

a second generator circuit coupled to receive the incoming data signals from the first and second data ports and the power supply voltage signal, the second generator circuit generating a second pair of complementary precursor control signals on respective third and fourth main control nodes;

a first Vdd/energy detect control circuit coupled to receive the power supply voltage signal and the first energy detect signal and coupled to drive the first, second, third and fourth main control nodes to cause the switch circuit to open when the power supply voltage signal indicates a valid power supply voltage and when the first energy detect signal has the first state; and a second Vdd/energy detect control circuit coupled to receive the power supply voltage signal and the second energy detect signal and coupled to control the first, second, third and fourth main control nodes to cause the switch circuit to open when the power supply voltage signal indicates a valid power supply voltage and when the second energy detect signal has the first state, wherein the first pair of complementary precursor control signals and the second pair of complementary precursor control signals correspond to a first pair of complementary control signals and a second pair of complementary control signals, respectively.

13. The relay switch of claim 1, wherein the power supply voltage signal indicates a valid power supply voltage when the power supply voltage signal has a voltage level greater than a predetermined voltage level threshold and the power supply voltage signal indicates an invalid power supply voltage when the power supply voltage signal has a voltage level less than or equal to the predetermined voltage level threshold.

* * * * *